(12) United States Patent
Hatcher et al.

(10) Patent No.: US 10,164,121 B2
(45) Date of Patent: Dec. 25, 2018

(54) STACKED INDEPENDENTLY CONTACTED FIELD EFFECT TRANSISTOR HAVING ELECTRICALLY SEPARATED FIRST AND SECOND GATES

(71) Applicant: Samsung Electronics Co., Ltd., Suwon-si, Gyeonggi-do (KR)

(72) Inventors: Ryan M. Hatcher, Austin, TX (US); Borna J. Obradovic, Leander, TX (US); Joon Goo Hong, Austin, TX (US); Rwik Sengupta, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/181,327

(22) Filed: Jun. 13, 2016

(65) Prior Publication Data

US 2017/0148922 A1    May 25, 2017

Related U.S. Application Data

(60) Provisional application No. 62/260,097, filed on Nov. 25, 2015.

(51) Int. Cl.
| | |
|---|---|
| *H01L 29/786* | (2006.01) |
| *H01L 29/06* | (2006.01) |
| *H01L 29/423* | (2006.01) |
| *H01L 29/66* | (2006.01) |
| *H01L 29/778* | (2006.01) |

(52) U.S. Cl.
CPC .... *H01L 29/78696* (2013.01); *H01L 29/0673* (2013.01); *H01L 29/42392* (2013.01); *H01L 29/66742* (2013.01); *H01L 29/778* (2013.01); *H01L 29/78618* (2013.01); *H01L 29/78645* (2013.01)

(58) Field of Classification Search
CPC .......... H01L 29/78696; H01L 29/0673; H01L 29/66742; H01L 29/78645; H01L 29/78618; H01L 29/42392
See application file for complete search history.

(56) References Cited

U.S. PATENT DOCUMENTS

| | | | |
|---|---|---|---|
| 7,615,445 B2 | 11/2009 | Chien et al. | |
| 8,203,187 B2 | 6/2012 | Lung et al. | |
| 8,570,808 B2 | 10/2013 | Park et al. | |
| 8,618,614 B2 | 12/2013 | Scheuerlein | |
| 9,129,859 B2 | 9/2015 | Liu et al. | |
| 2008/0108199 A1 | 5/2008 | Schwerin | |
| 2012/0175594 A1* | 7/2012 | Chen | H01L 29/4908 257/29 |
| 2012/0292665 A1 | 11/2012 | Marino et al. | |
| 2013/0341704 A1* | 12/2013 | Rachmady | H01L 29/66545 257/327 |

(Continued)

*Primary Examiner* — Michael Jung
(74) *Attorney, Agent, or Firm* — Lewis Roca Rothgerber Christie LLP

(57) ABSTRACT

A semiconductor device including: a substrate; a first active layer on the substrate and including a first channel between a source and a drain; a second active layer stacked on the first active layer, the second active layer including a second channel between the source and the drain; a first gate corresponding to the first channel; and a second gate electrically separated from the first gate and corresponding to the second channel.

8 Claims, 41 Drawing Sheets

(56) References Cited

U.S. PATENT DOCUMENTS

| | | | |
|---|---|---|---|
| 2014/0091360 A1* | 4/2014 | Pillarisetty | H01L 21/8258 |
| | | | 257/190 |
| 2014/0147473 A1* | 5/2014 | Yao | H01M 6/40 |
| | | | 424/400 |
| 2014/0151639 A1* | 6/2014 | Chang | H01L 29/42392 |
| | | | 257/27 |
| 2015/0036414 A1 | 2/2015 | Yan et al. | |
| 2015/0098274 A1 | 4/2015 | Rhie | |
| 2015/0123215 A1 | 5/2015 | Obradovic et al. | |
| 2015/0340371 A1* | 11/2015 | Lue | H01L 21/28282 |
| | | | 257/324 |
| 2015/0340457 A1* | 11/2015 | Xie | H01L 29/66545 |
| | | | 257/288 |
| 2016/0079394 A1* | 3/2016 | Li | H01L 29/42392 |
| | | | 257/347 |
| 2016/0141366 A1* | 5/2016 | Lai | H01L 29/1033 |
| | | | 257/9 |
| 2016/0254528 A1* | 9/2016 | Yu | C01G 1/02 |
| | | | 429/188 |
| 2017/0135208 A1* | 5/2017 | Jung | H05K 1/09 |

* cited by examiner

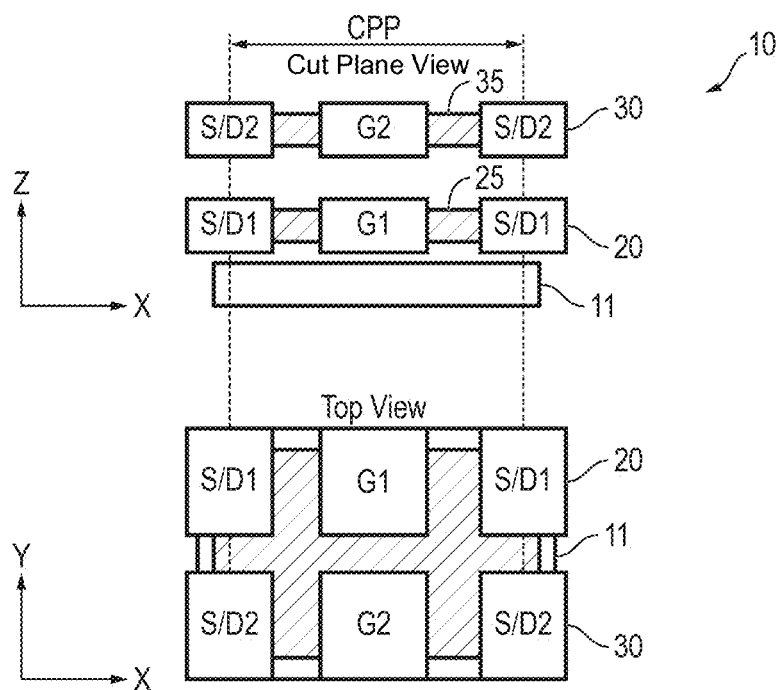
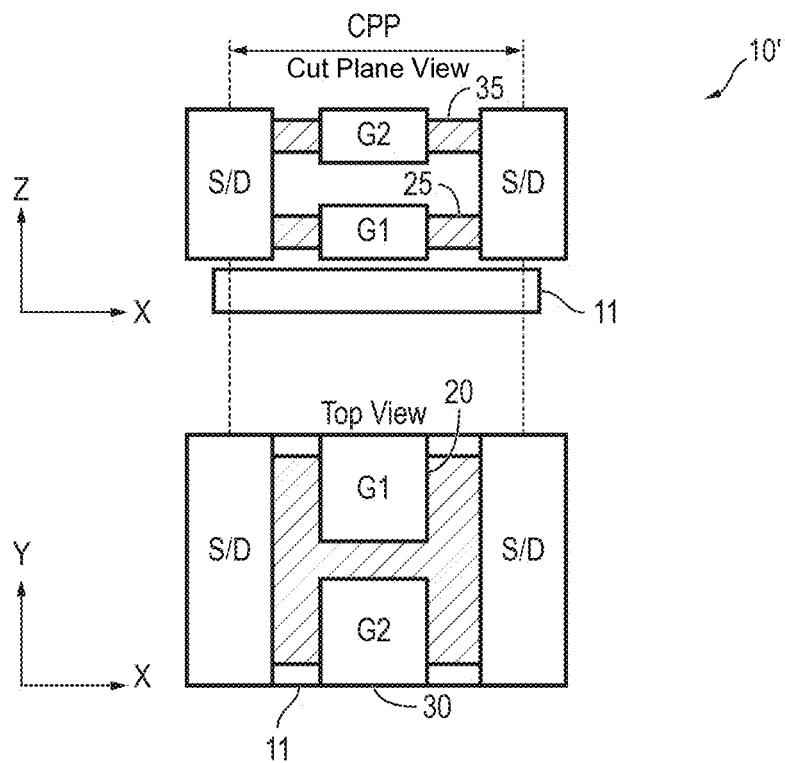
FIG. 1A
FIG. 1B

STACKED INDEPENDENTLY CONTACTED FIELD EFFECT TRANSISTOR HAVING ELECTRICALLY SEPARATED FIRST AND SECOND GATES

CROSS-REFERENCE TO RELATED APPLICATION(S)

This utility patent application claims priority to and the benefit of U.S. Provisional Patent Application Ser. No. 62/260,097, filed Nov. 25, 2015, entitled "STACKED INDEPENDENTLY CONTACTED FIELD EFFECT TRANSISTOR," the entire content of which is incorporated herein by reference.

BACKGROUND

CMOS logic is approaching the limits of front end of the line (FEOL), middle of the line (MOL) and back end of line (BEOL) area scaling. Area scaling is desirable not only because of the increased device density but also because area scaling reduces MOL/BEOL parasitic resistance by reducing the run length of traces in a given circuit. However, quantum transport simulations of metal wires indicate that even under ideal conditions, resistivities of traces may increase super-linearly with the reduction of the cross section at advanced nodes (>5 nm). Furthermore, if MOL/BEOL scaling stops due to the super-linear increase in line resistivities, any advantages afforded by FEOL scaling may be reduced or nullified, because the areal density of devices will be artificially reduced in order to satisfy the place and route constraints imposed by the non-scaled MOL/BEOL.

In addition to the fundamental resistivity limits facing MOL/BEOL scaling, there are fundamental limits to contacted poly pitch (CPP) scaling of the FEOL in the direction of transport. For example, there is a fundamental limit to the contact resistivities at the source/drain and electrostatic control of the gates. Contact resistivity limits the minimum area used to keep the contact resistance, and thus, to keep the parasitic resistance small enough so that the total impedance of the circuit is dominated by the state of the channel. The minimum gate length used to impose electrostatic control of the channel is largely a function of equivalent oxide thickness (EOT) of the gate stack, geometry of the channel and gate, and the gate material. Even under ideal conditions (e.g., smallest possible EOT, gate all around nanowire, and indirect material), there may be some minimum gate length which ultimately limits CPP scaling. These are just a few examples of the factors that may limit FEOL area scaling.

The above information disclosed in this Background section is for enhancement of understanding of the background of the invention, and therefore, it may contain information that does not constitute prior art.

SUMMARY

According to one or more example embodiments of the present invention, both methods of fabrication for and applications of a device referred to as Stacked Independently Contacted Field Effect Transistors (SICFETs) are provided. SICFETs enable 3D stacking of devices, and thus, result in FEOL scaling without the need to scale CPP and cell height. In addition, SICFETs enable standard cells with less MOL/BEOL wiring compared to those same circuits implemented with existing 3-terminal FETs. SICFETs enable this reduction in MOL wiring by pulling in some of the connectivity between different elements in the circuit into the devices itself, whereas in existing devices, such connectivity is usually implemented by MOL wiring. Thus the SICFETs according to one or more example embodiments of the present invention enable the design of cells with less MOL wiring, and therefore, allow for additional system area scaling independent of traditional FEOL/MOL/BEOL scaling.

One or more example embodiments according to the present invention provide a vertical stack of at least two channels that are oriented in the plane of the substrate (e.g., transport is parallel to the surface of the substrate) with common source and drain or independent source and drain, where individual channels within the stack can be gated individually. Such a structure provides a unique circuit element that has the footprint of a single device with two or more parallel individually gated channels from source to drain. In addition, the structure may be extended to include additional gates that are in series at one or more levels.

One or more example embodiments according to the present invention provide a nanosheet FET structure including a source and drain connected by two stacked layers of channels with each of the channel layers gated individually such that there are two individually gated parallel current paths from source to drain.

One or more example embodiments according to the present invention provide a nanosheet FET structure similar to the one described above with two individually contacted gated regions in series in each layer and a total of four individual gate contacts controlling two current paths from source to drain.

One or more example embodiments according to the present invention provide a nanosheet FET structure similar to the one or more described above with more than two stacked layers of channels connecting the source to drain, some of which are controlled by one gate contact and the rest of which are connected by another gate contact.

One or more example embodiments according to the present invention provide a nanosheet FET structure similar to the one or more described above with three stacked layers of channels, each layer including of two individually gated regions in series. There are three gate contacts each of which controls two channel regions, one in each layer so that the devices passes current through at least one of the channel layers if two or three of the three addressable gates are biased to the on state for a given polarity (e.g., low for PMOS and high for NMOS).

One or more example embodiments according to the present invention provide an area scaling advantage compared to existing technologies. This area scaling advantage is realized both in the FEOL by reducing the number of devices used to implement a given circuit as well as a reduction in the MOL/BEOL wiring by effectively folding certain connections into the device itself that would otherwise be made by MOL wiring.

One or more example embodiments according to the present invention provide a gate contact controlling the lower most channel(s) on the same side of the device as the source/drain contacts that are contacting the upper most channel(s) and vice versa (e.g., the other side of the device has a gate contact controlling the upper most channel(s) and source/drain contacts contacting the lower most channels). This may be desirable for some circuits where the MOL wiring can be simplified.

According to one or more example embodiments of the present invention, a semiconductor device includes: a substrate; a first active layer on the substrate and including a first channel between a source and a drain; a second active layer stacked on the first active layer, the second active layer including a second channel between the source and the drain; a first gate corresponding to the first channel; and a second gate electrically separated from the first gate and corresponding to the second channel.

In an embodiment, the first and second active layers may include nanosheets.

In an embodiment, each of the channels may be oriented in a direction parallel to a plane of the substrate.

In an embodiment, the semiconductor device may further include a plurality of first active layers, each of the first active layers comprising a channel, at a same vertical level as the first active layer, and a plurality of second active layers, each of the second active layers comprising a channel, at a same vertical level as the second active layer, and one or more of the active layers may constitute a FET.

In an embodiment, the source and the drain may include a first source and a first drain corresponding to the first channel, and a second source and a second drain corresponding to the second channel.

In an embodiment, at least two of the channels may be configured to be controlled by a single gate contact.

In an embodiment, the semiconductor device may further include: a third active layer stacked on the second active layer, wherein each of the layers includes two individually gated channel regions in series; and a third gate corresponding to the third active layer, wherein each of the gates is configured to control two of the channel regions in corresponding ones of the layers, so that the device passes current through at least one of the channel layers when two or three of the first, second, and third gates are biased to an on state.

According to one or more example embodiments of the present invention, a method of fabricating a semiconductor device includes: forming a structure including at least two active layers that are vertically stacked; etching the structure to form separate stacks, each of the stacks including portions of the at least two active layers; and depositing metals to form gate contacts and source and drain contacts to form vertically stacked FETs.

In an embodiment, the forming of the structure may include: forming a first sacrificial layer on a substrate; forming a first active layer from among the active layers on the first sacrificial layer; forming a second sacrificial layer on the first active layer; and forming a first low k layer on the second sacrificial layer.

In an embodiment, the forming of the structure may further include: forming a third sacrificial layer on the first low k layer; forming a second active layer from among the active layers on the third sacrificial layer; forming a fourth sacrificial layer on the second active layer; and forming a second low k layer on the fourth sacrificial layer.

In an embodiment, the method further may further include: forming a plurality of spacers to cover each of the separate stacks; and forming a plurality of dummy fills between the spacers to cover each of the separate stacks.

In an embodiment, the method may further include: partially etching the dummy fills of every other source and drain trenches of the separate stacks to expose a portion of a side of the third and fourth sacrificial layers; and partially etching back the exposed portion of the side of the third and fourth sacrificial layers to form first groove portions.

In an embodiment, the method may further include: forming low k material in the every other source and drain trenches; etching back the low-k material to form low-k spacers in the first groove portions; and oxidizing an exposed portion of a side of the second active layer.

In an embodiment, the method may further include: etching remaining portions of the dummy fills of the every other source and drain trenches to expose a portion of a side of the first and second sacrificial layers; directionally etching the exposed portion of the side of the first and second sacrificial layers to form first openings; doping with N-type and/or P-type dopant materials for first source and drain contacts; and depositing first source and drain metals from among the metals to form the first source and drain contacts.

In an embodiment, the method may further include: partially etching the dummy fills of remaining source and drain trenches of the separate stacks to expose a portion of another side of the third and fourth sacrificial layers; directionally etching the exposed portion of the other side of the third and fourth sacrificial layers to form second openings; doping with N-type and/or P-type dopant materials for second source and drain contacts; and depositing second source and drain metals from among the metals to form the second source and drain contacts.

In an embodiment, the method may further include: partially etching the dummy fills of every other gate trenches of the separate stacks to expose another portion of the side of the third and fourth sacrificial layers; and partially etching back the exposed other portion of the side of the third and fourth sacrificial layers to form second groove portions.

In an embodiment, the method may further include: forming low k material in the every other gate trenches; etching back the low-k material to form low-k spacers in the second groove portions; and oxidizing another exposed portion of the side of the second active layer.

In an embodiment, the method may further include: etching remaining portions of the dummy fills of the every other gate trenches to expose another portion of the side of the first and second sacrificial layers; directionally etching the exposed other portion of the side the first and second sacrificial layers to form third openings; forming oxides in the third openings; and depositing first gate metals from among the metals to form first gate contacts.

In an embodiment, the method may further include: partially etching the dummy fills of remaining gate trenches of the separate stacks to expose another portion of the other side of the third and fourth sacrificial layers; directionally etching the exposed other portion of the other side of the third and fourth sacrificial layers to form fourth openings; forming oxides in the fourth openings; and depositing second gate metals from among the metals to form second gate contacts.

According to one or more example embodiments of the present invention, a stacked independently contacted field effect transistor (SICFET) device includes: a substrate; a first active layer on the substrate; a first low k layer on the first active layer; a first gate metal between the substrate and the first active layer, and between the first active layer and the first low k layer; a second active layer on the first low k layer and overlapping with the first active layer in a vertical direction; a second low k layer on the second active layer; and a second gate metal between the first low k layer and the second active layer, and between the second active layer and the second low k layer, contacts of the first and second gate metals being aligned horizontally on a plane parallel to a top surface of the SICFET.

BRIEF DESCRIPTION OF THE DRAWINGS

The above and other aspects and features of the present invention will become more apparent to those skilled in the art from the following detailed description of the example embodiments with reference to the accompanying drawings.

FIG. 1A is a conceptual diagram of a cut plane through a middle of the device and a top view of contact layouts of a stacked independently contacted field effect transistor (SICFET) device according to one or more example embodiments of the present invention.

FIG. 1B is a conceptual diagram of a cut plane through a middle of the device and a top view of contact layouts of a SICFET device according to one or more example embodiments of the present invention.

DETAILED DESCRIPTION

Figure 2A:
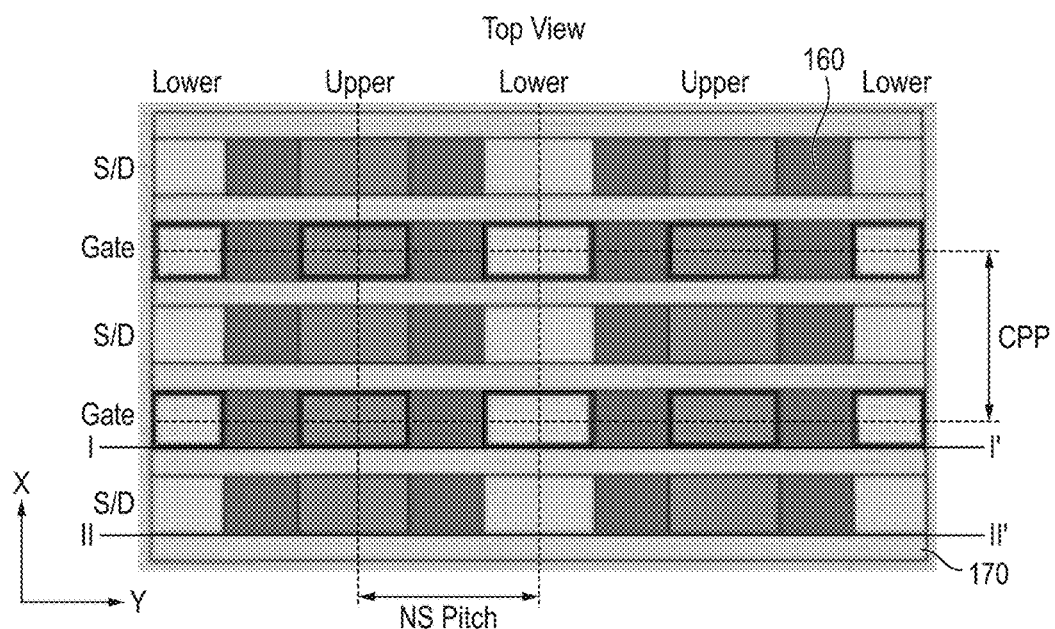
FIG. 2A is a schematic top view of a SICFET device according to one or more example embodiments of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

For certain circuits, such as the standard NAND cell in older technologies (~130 nm and before), a single device may have two separate logical gate contacts. In this case, there are two gate contacts on an NMOS pull down device in series from source to drain. Such a configuration reduces or eliminates MOL wiring that would be used to connect the drain of the first device to the source of the next, if such a circuit was implemented with two separate NMOS devices.

However, for technologies that rely on self-aligned processes to define the gate and contact regions, it is impractical or may not be possible to put two logical gates in series, and so this technique has not been able to be used for several nodes, and will not be able to be used for any advanced nodes going forward.

One or more example embodiments according to the present invention provide a vertical stack of at least two field effect transistors (FETs) with fully independent source, gate, and drain contacts (e.g., one logical FET is stacked on top of another), each of the FETs having one or more physical channels. One or more example embodiments according to the present invention provide a vertical stack of at least two channels that are oriented in the plane of the substrate (e.g., transport is parallel to the surface of the substrate) with common source and drain, where individual channels within the stack can be gated individually. Such structures provide a unique circuit element that has the footprint of a single device with two or more parallel individually gated channels from source to drain. In addition, the structures may be extended to include additional gates that are in series at one or more levels.

FIG. 1A is a conceptual diagram of a cut plane through a middle of the device and a top view of a stacked independently contacted field effect transistor (SICFET) device according to an example embodiment of the present invention. As can be seen in FIG. 1A, two field effect transistors (FETs) 20 and 30 are formed at two separate nanosheets on a substrate (e.g., a bottom oxide) 11 that are offset from each other along a vertical direction (e.g., along a Z-axis direction). According to one or more embodiments, the substrate 11 may be any suitable crystalline material suitable for epitaxial (e.g., single crystal) growth, for example, silicon, SiGe, etc.

A first FET (e.g., a lower FET) 20 includes a first source S1, a first gate G1, and a first drain D1 that are arranged along a horizontal direction (e.g., along an X-axis direction), wherein the gate G1 is configured to control a first channel 25. As shown in FIG. 1A, The first FET 20 has fully independent source, gate, and drain contacts, each on a top and a side of the nanosheet stack 10.

A second FET (e.g., an upper FET) 30 includes a second source S2, a second gate G2, and a second drain D2 that are arranged along the horizontal direction, wherein the second gate G2 is configured to control a second channel 35. As shown in FIG. 1A, the second FET 30 has fully independent source, gate, and drain contacts, each on a top and a side of the nanosheet stack 10.

The first and second FETs 20 and 30 are also offset in a horizontal direction (e.g., along a Y-axis direction) parallel to the X-axis direction on planes of the nanosheets. Further, as can be seen from the top view in FIG. 1A, contacts to the gates G1 and G2 may be accessed from sides of the nanosheet stack 10.

While FIG. 1A shows the first and second FETs 20 and 30 having fully independent source, gate, and drain contacts, the present invention is not limited thereto. For example, as shown in FIG. 1B, a SICFET device may include at least two channels 25 and 35 with common source and drain S/D. Each of the channels 25 and 35 are individually gated, with the first channel 25 being gated by a first gate G1 and the second channel 35 being gated by a second gate G2. As shown in FIG. 1B, each of the first and second gates G1 and G2 and the common source and drain S/D have contacts on a top and on a side of the nanosheet stack 10'.

FIG. 2A is a schematic top view of a SICFET device according to an example embodiment of the present invention. As can be seen in FIG. 2A, upper and lower FETs are arranged along a Y-axis, and upper and lower elements of the respective upper and lower FETs are arranged along an X-axis that is substantially perpendicular to the Y-axis. The nanosheets are separated from each other along the Y-axis by a pitch of nanosheet (NS) pitch. Further, each gate is separated from adjacent gates by a distance of CPP along the X-axis. The CPP refers to a gate to gate distance along a direction of transport, and the NS pitch refers to a distance from the center of one nanosheet to the center of an adjacent nanosheet. FIG. 2A further illustrates dummy fills 160 that are arranged between adjacent gates and between adjacent source/drains S/D along the Y-axis direction. FIG. 2A also illustrates spacers 170 that are arranged along the X-axis direction between each adjacent gate and source/drain S/D.

Figure 2B:
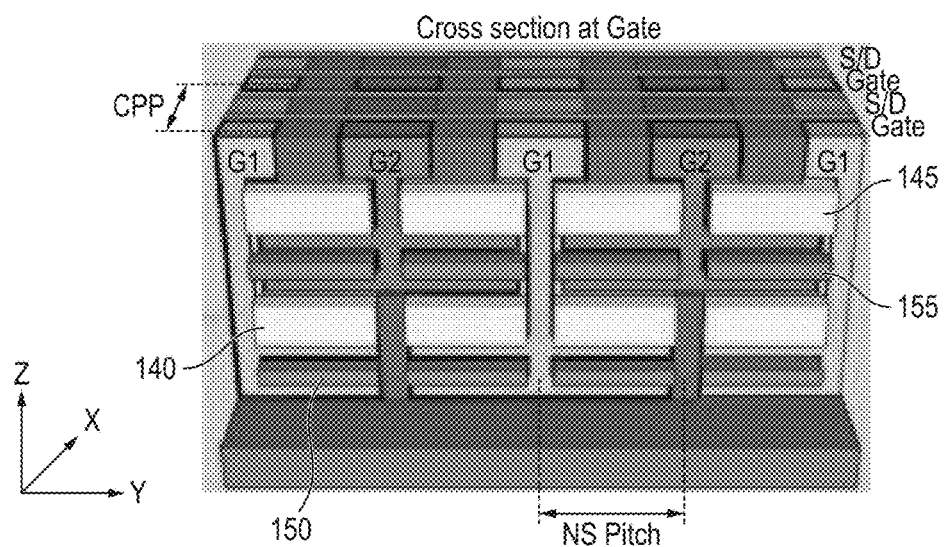
FIG. 2B is a schematic cross-sectional view of the SICFET device along the line I-I' of FIG. 2A.

FIG. 2B is a schematic cross-sectional view of the SICFET device along the line I-I' of FIG. 2A. As can be seen in FIG. 2B, first gates or first gate electrodes (e.g., lower gates) G1 and second gates or second gate electrodes (e.g., upper gates) G2 are alternately arranged along the Y-axis that is substantially perpendicular to the X-axis. The first gates G1 extend in a Z-axis direction to make electrical contacts with the respective lower NS layers (e.g., NS channels) 150. The second gates G2 extend in the Z-axis direction to make electrical contacts with the respective upper NS layers (e.g., NS channels) 155. A row of upper spacers 145 may be arranged along the Y-axis between the gate electrodes (G1 and G2) and the respective upper NS layers 155, to reduce or suppress capacitive coupling between the upper and lower gates G1 and G2. Further, a row of lower spacers 140 may be arranged along the Y-axis between the respective upper NS layers 155 and the respective lower NS layers 150, to reduce or suppress capacitive coupling between the upper and lower gates G1 and G2.

Figure 2C:
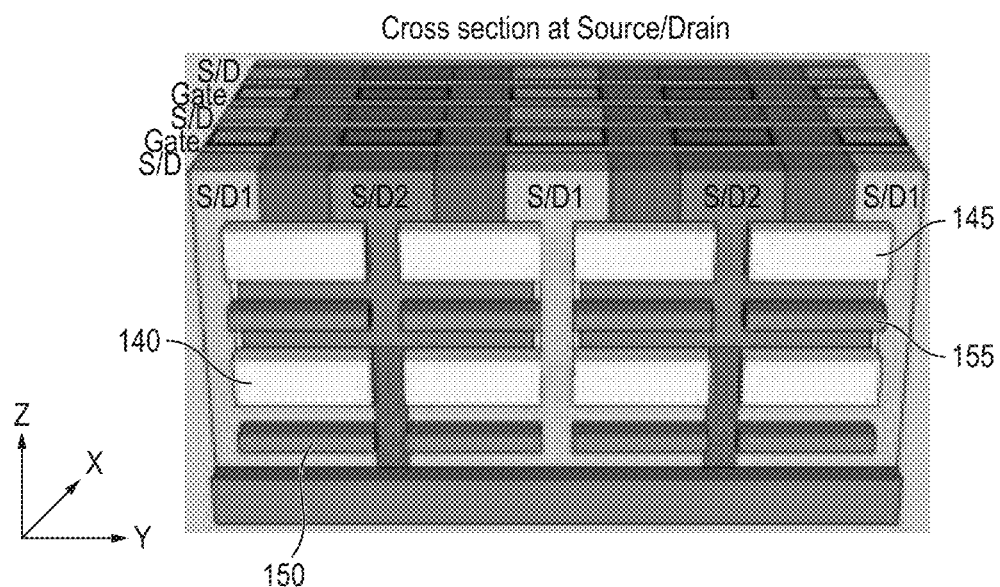
FIG. 2C is a schematic cross-sectional view of the SICFET device along the line II-II' of FIG. 2A.

FIG. 2C is a schematic cross-sectional view of the SICFET device along the line II-II' of FIG. 2A. As can be seen in FIG. 2C, first source/drains (or first source/drain electrodes) S/D1 and second source/drains (or second source/drain electrodes) S/D2 are alternately arranged along the Y-axis that is substantially perpendicular to the X-axis. Those skilled in the art would appreciate that when one of the source/drains operates as a source, an adjacent one of the source/drains operates as a drain, and vice versa.

The first source/drains S/D1 extend in the Z-axis direction to make electrical contacts with the respective lower NS layers (e.g., NS channels) 150. The second source/drains S/D2 extend in the Z-axis direction to make electrical contacts with the respective upper NS layers (e.g., NS channels) 155. The row of upper spacers 145 may be arranged along the Y-axis between the source/drains and the respective upper NS layers 155, to reduce or suppress capacitive coupling between the first and second source/drains S/D1 and S/D2. Further, the row of lower spacers 140 may be arranged along the Y-axis between the respective upper NS layers 155 and the respective lower NS layers 150 to reduce or suppress capacitive coupling between the first and second source/drains S/D1 and S/D2.

Figure 2D:
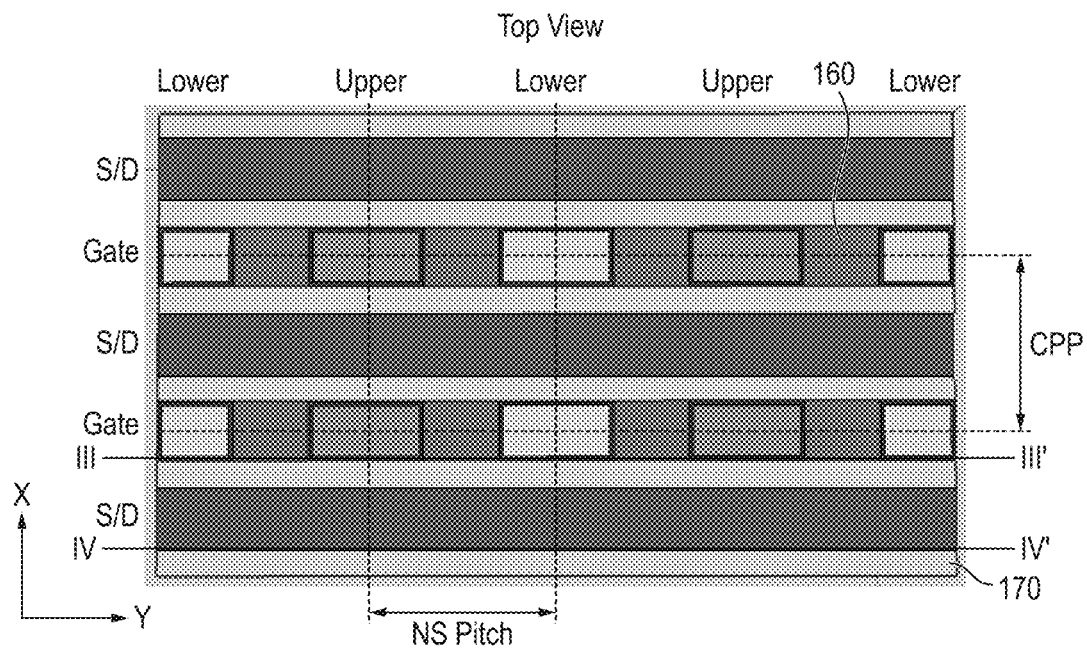
FIG. 2D is a schematic top view of a SICFET device according to one or more example embodiments of the present invention.

FIG. 2D is a schematic top view of a SICFET device according to an example embodiment of the present invention. As can be seen in FIG. 2D, upper and lower FETs are arranged along a Y-axis, and upper and lower elements of the respective upper and lower FETs are arranged along an X-axis that is substantially perpendicular to the Y-axis. Unlike that of FIG. 2A, the SICFET device of FIG. 2D includes common source and drains S/D. The nanosheets are separated from each other along the Y-axis by a pitch of nanosheet (NS) pitch. Further, each gate is separated from adjacent gates by a distance of CPP along the X-axis. FIG. 2D further illustrates dummy fills 160 that are arranged between adjacent gates along the Y-axis direction. FIG. 2D also illustrates spacers 170 that are arranged along the X-axis direction between each adjacent gate and common source/drain S/D.

Figure 2E:
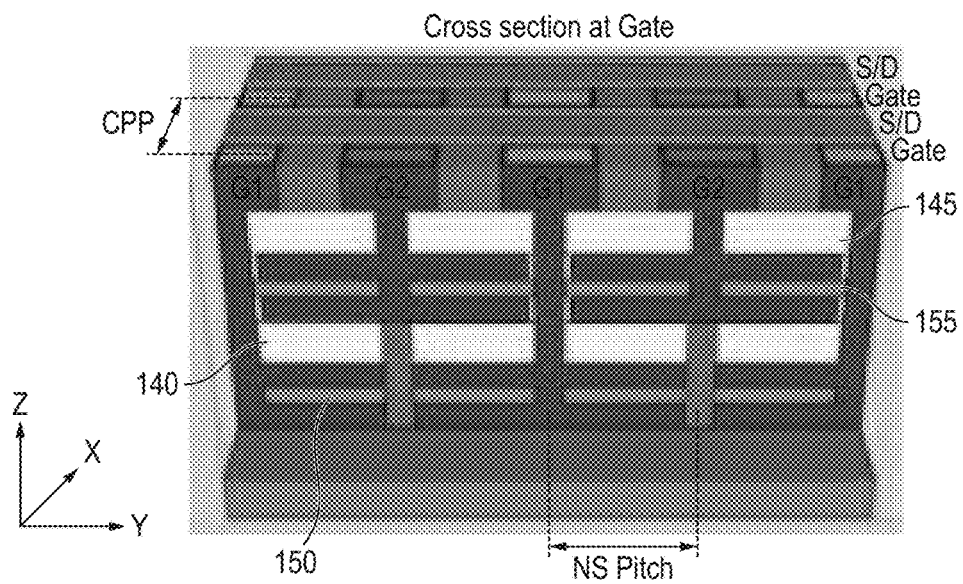
FIG. 2E is a schematic cross-sectional view of the SIFET device along the line III-III' of FIG. 2D.

FIG. 2E is a schematic cross-sectional view of the SICFET device along the line of FIG. 2D. As can be seen in FIG. 2E, first gates or first gate electrodes (e.g., lower gates) G1 and second gates or second gate electrodes (e.g., upper gates) G2 are alternately arranged along the Y-axis that is substantially perpendicular to the X-axis. The first gates G1 extend in a Z-axis direction to make electrical contacts with the respective lower NS layers (e.g., NS channels) 150. The second gates G2 extend in the Z-axis direction to make electrical contacts with the respective upper NS layers (e.g., NS channels) 155. A row of upper spacers 145 may be arranged along the Y-axis between the gate electrodes (G1 and G2) and the respective upper NS layers 155, to reduce or suppress capacitive coupling between the upper and lower gates G1 and G2. Further, a row of lower spacers 140 may be arranged along the Y-axis between the respective upper NS layers 155 and the respective lower NS layers 150, to reduce or suppress capacitive coupling between the upper and lower gates G1 and G2.

Figure 2F:
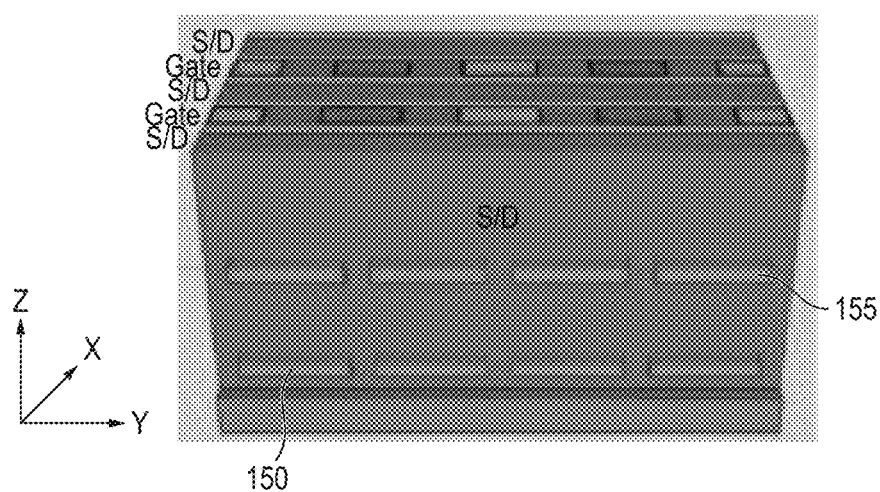
FIG. 2F is a schematic cross-sectional view of the SICFET device along the line IV-IV' of FIG. 2D.

FIG. 2F is a schematic cross-sectional view of the SICFET device along the line IV-IV' of FIG. 2D. As can be seen in FIG. 2F, each of the common source/drains (or common source/drain electrodes) S/D make electrical contacts with the lower NS layers (e.g., NS channels) 150 and the upper NS layers (e.g. NS channels) 155. Those skilled in the art would appreciate that when one of the source/drains operates as a source, an adjacent one of the source/drains operates as a drain, and vice versa.

Figure 3:
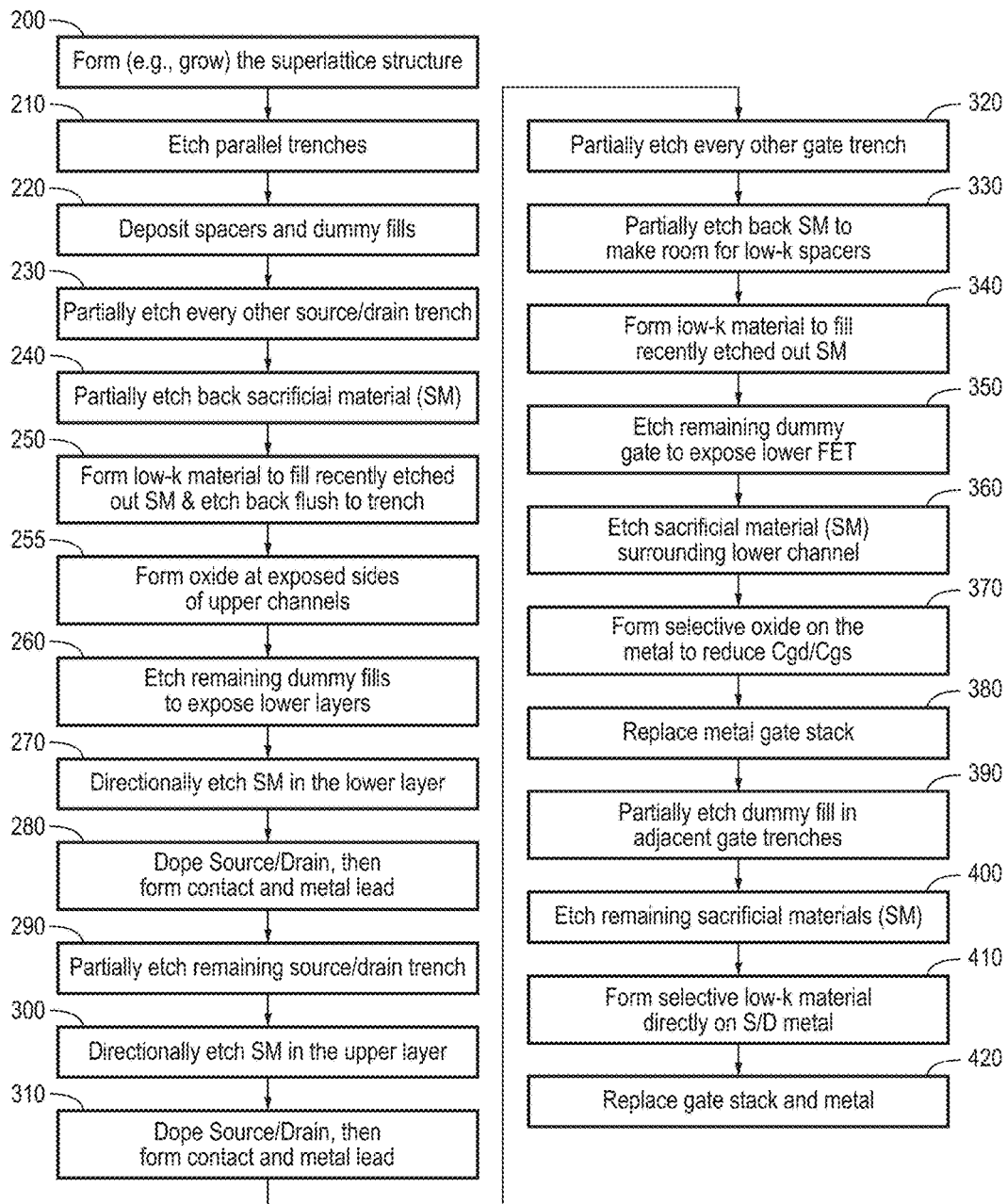
FIG. 3 is a flow diagram illustrating a fabrication process of the SICFET device of FIGS. 2A-2C according to one or more example embodiments of the present invention.

FIG. 3 is a flow diagram illustrating a fabrication process of the SICFET device of FIGS. 2A-2C according to one or more example embodiments of the present invention. However, the present invention is not limited to the sequence or number of the operations of the method shown in FIG. 3, and can be altered into any desired sequence or number of operations as recognized by a person of ordinary skill in the art. For example, in some embodiments, the order may vary, or the method may include fewer or additional operations.

The below description for features and components of the SICFET device of FIGS. 2A-2C that are the same or substantially the same as those of the SICFET device of FIGS. 2D-2F may be applied in a similar or substantially similar manner thereto, and thus, will not be repeated. However, differences between the SICFET device of FIGS. 2A-2C and the SICFET device of FIGS. 2D-2F will be described in more detail below.

Figure 4:
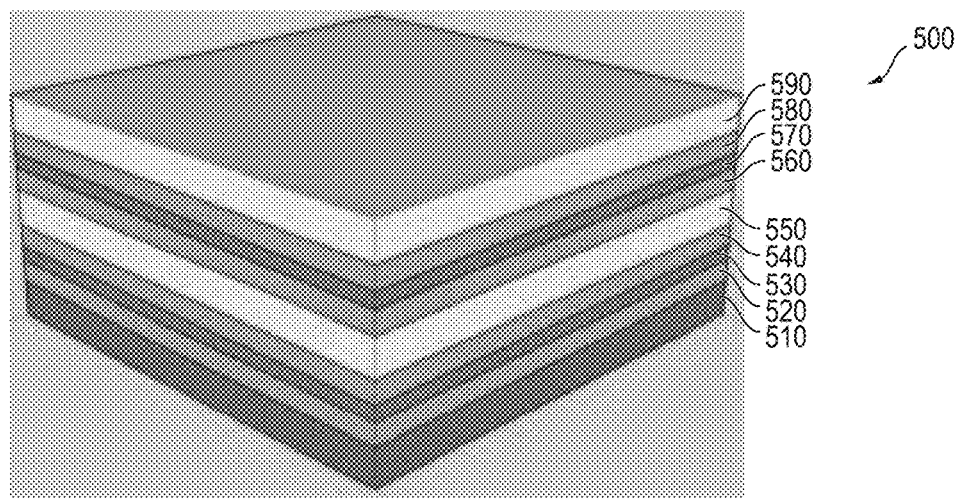
FIGS. 4-27B are fabrication process diagrams illustrating step-by-step processes of fabricating a SICFET device according to one or more example embodiments of the present invention.

Referring to FIG. 3, a superlattice structure 500 is formed (e.g., grown) at block 200 as shown in FIG. 4. As shown in FIG. 4, the superlattice structure 500 has two or more active layers 530 and 570. On a substrate 510, a first sacrificial layer 520 having a thickness of $t_{IS}$ is formed (or grown). In one or more example embodiments, the sacrificial layers may be formed of one or more sacrificial materials (SM), which may include, for example, SiGe or silicon. In other embodiments, the sacrificial layers may be grown or formed using any other suitable material or materials known to those skilled in the art.

On the first sacrificial layer 520, a first active layer 530 is formed (or grown) to a thickness of $t_{NS}$. According to one or more example embodiments, the active layers are formed using an active material (AM), which for example, may include silicon or SiGe. In other embodiments, the active layers may be grown or formed using any other suitable material or materials known to those skilled in the art. The active layers may be referred to herein as nanosheets (NS) in their undivided whole form, or when etched or separated into NS channels. On the first active layer 530, a second sacrificial layer 540 is formed (e.g, grown) to a thickness of $t_{IS}$.

On the second sacrificial layer 540, a first low k layer 550 is formed (e.g., grown) to a thickness of $t_{LK}$. The low k layer 550 in one or more example embodiments may be formed of an active material (AM), which for example may be silicon or SiGe, or may be formed of another material (e.g., a low k material, LK), which may for example be ZnS, where k is the dielectric constant. In other embodiments the low k layers may be formed of any other suitable material known to those skilled in the art.

On the first low k layer 550, a third sacrificial layer 560 is formed (e.g., grown) to a thickness of $t_{IS}$, and on the third sacrificial layer 560, a second active layer 570 is formed (e.g., grown) to a thickness of $I_{NS}$. On the second active layer 570, a fourth sacrificial layer 580 is formed (e.g., grown) to a thickness of $t_{IS}$. Finally, on the fourth sacrificial layer 580, a second low k layer 590 is formed (e.g., grown) to a thickness of $I_{LK}$ to form the superlattice structure 500.

According to one or more embodiments of the present invention, the thickness $t_{IS}$ may be equal to about 24 nm, the thickness $t_{NS}$ may be equal to about 6 nm, and the thickness $t_{LK}$ may be equal to about 18 nm, but the present invention is not limited thereto.

According to one or more example embodiments, the sacrificial materials (SM), active materials (AM), and/or the low k materials (LK) are selected in consideration of the selective chemistry, such that SM can be etched while leaving AM and/or LK intact. For example, when the AM includes silicon, the SM may include SiGe, and when the AM includes SiGe, the SM may include silicon.

Figure 5:
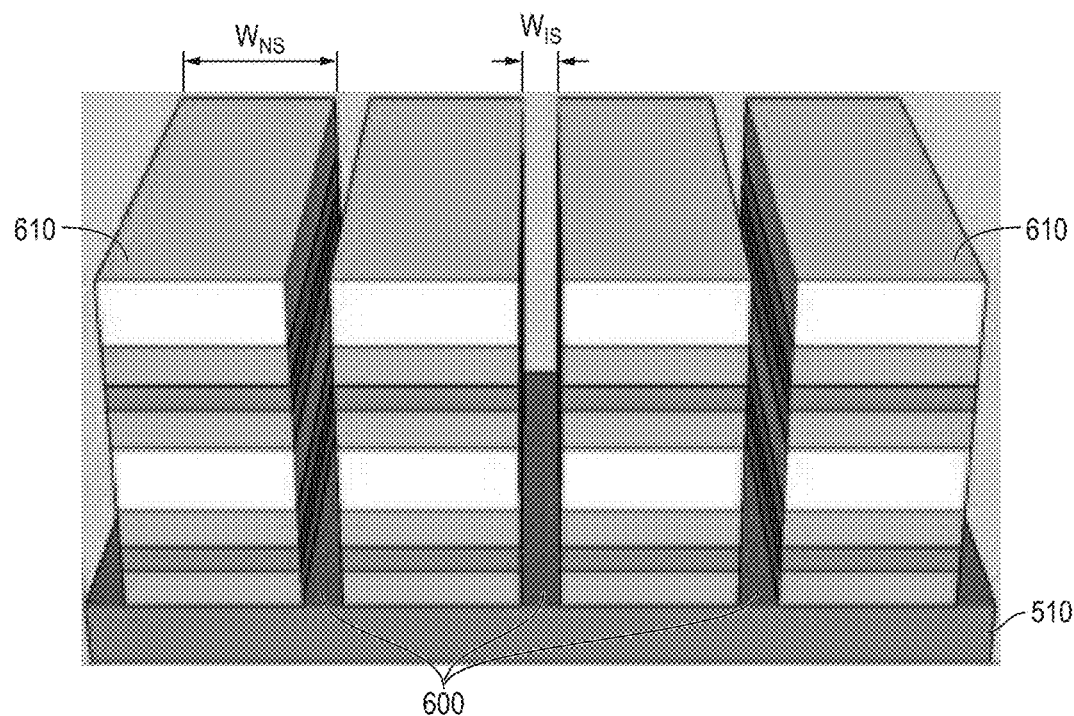

At block 210, the superlattice structure 500 is etched to form parallel trenches 600 as shown in FIG. 5. Each of the parallel trenches 600 is etched to at least the level of the substrate 510, thereby leaving behind nanosheet stacks 610. The width of the parallel channels 600 should be equal to a desired sheet to sheet distance $W_{JS}$. For example, in one or more example embodiments, the width of the parallel channels 600 is on the order of about 9 nm. The width of the parallel channels may be more or less than 9 nm in other example embodiments. Further, the width of the remaining materials between the parallel channels 600 (e.g., the width of the nanosheet stacks 610) should be equal to a desired width of the nanosheets $W_{NS}$. In one or more example embodiments, the width of the nanosheets or nanosheet stacks may be on the order of about 20 nm. In other example embodiments, the width of the nanosheets may be more or less than 20 nm.

Figure 6:
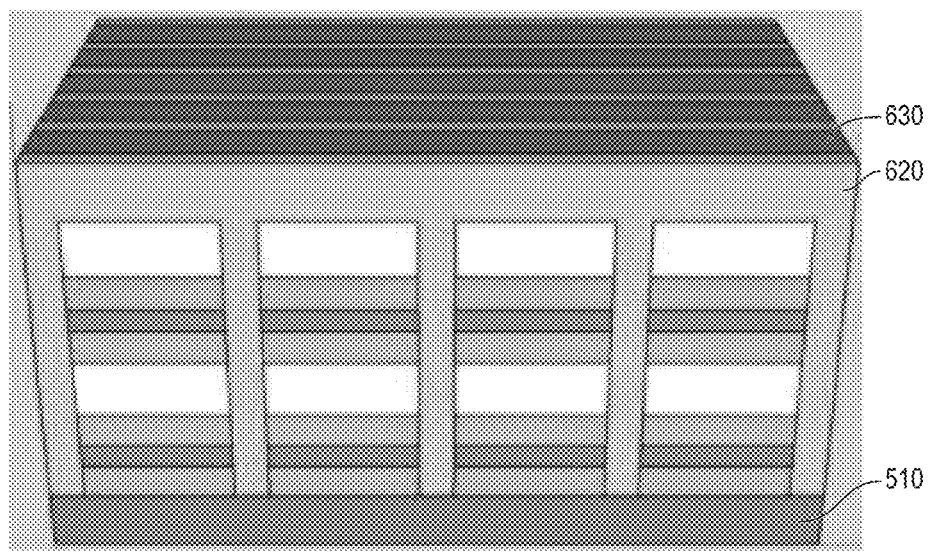

At block 220, as illustrated in FIG. 6, spacers 620 and dummy fills 630 are deposited on the substrate 510 to fill the trenches 600 (e.g., see FIG. 5), and the dummy fills 630 are deposited between the spacers 620. In one or more embodiments, the spacers 620 may include a nitride and the dummy fills 630 may include poly silicon, but the present invention is not limited thereto, and each of the spacers 620 and the dummy fills 630 may include any suitable material or materials.

Figure 7A:
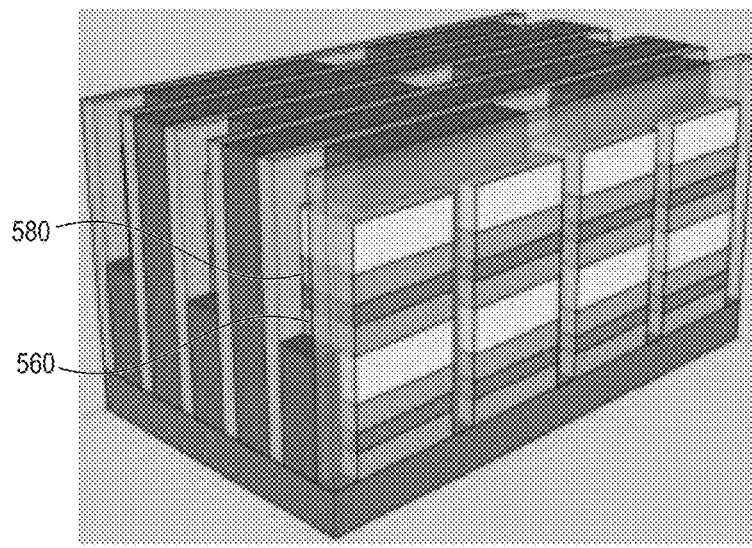
Figure 7B:
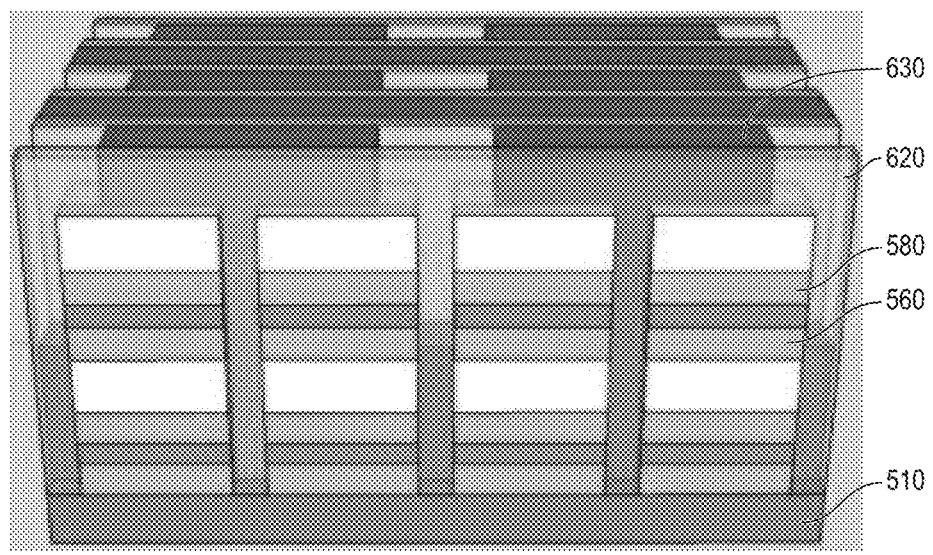
Figure 7C:
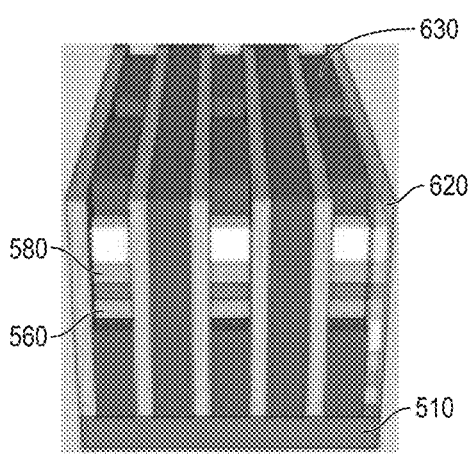

Then at block 230, the dummy fills 630 of every other source/drain trench is partially etched as illustrated in FIGS. 7A to 7C, which respectively, are a perspective view, a front view, and a side view of the superlattice structure after formation of the spacers/dummy fills at block 220 and partial etching at block 230. In one or more example embodiments, the structure is etched to expose all the sacrificial materials 560 and 580 surrounding the upper channels (e.g., upper NS channels) associated with the upper logical FETs for the every other source/drain trench. As illustrated in FIGS. 7A to 7C, the dummy fills 630 has been partially etched for every other source/drain trench.

Figure 8:
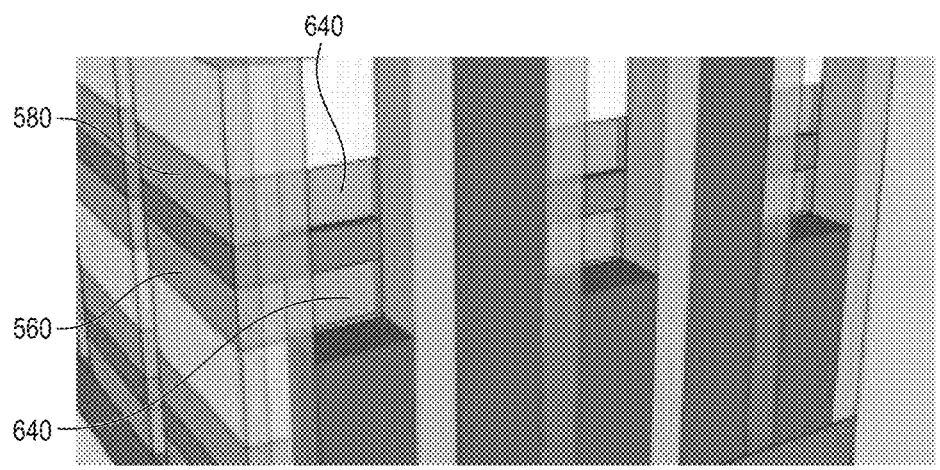
Figure 9A:
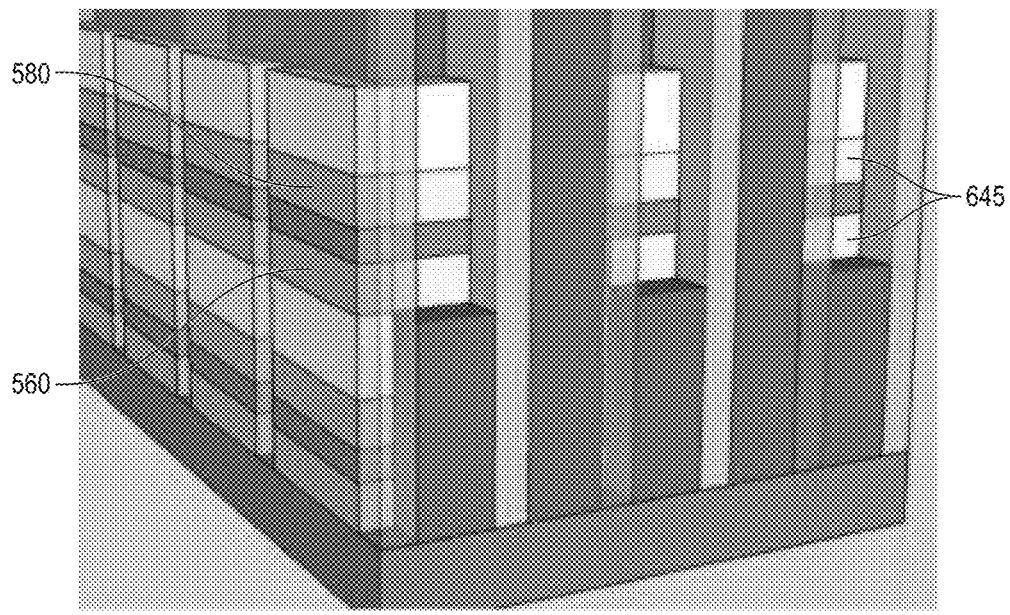

At block 240 according to one or more example embodiments, the sacrificial materials SM at sides of the upper sacrificial layers 560 and 580 that have been exposed at block 230 are partially etched back to form depressed or indented portions (e.g., groove portions) 640 as illustrated in FIG. 8, which is a partial view of a side of the superlattice structure. The groove portions 640 may be formed, for example, to make room for a low-k spacer (e.g., see 645 in FIG. 9A) to reduce capacitance between the stacked sources/drains.

At block 250, according to one or more example embodiments, a low-k material is formed (e.g., grown) in the corresponding trenches to fill the partially etched back groove portions 640 (see FIG. 8) of the third and fourth sacrificial layers 560 and 580, and then etched back to be flush to the side of the corresponding trenches to form the low-k spacers 645 in the groove portions 640 as shown in FIG. 9, which is a partial view of the side of the superlattice structure.

Figure 9B:
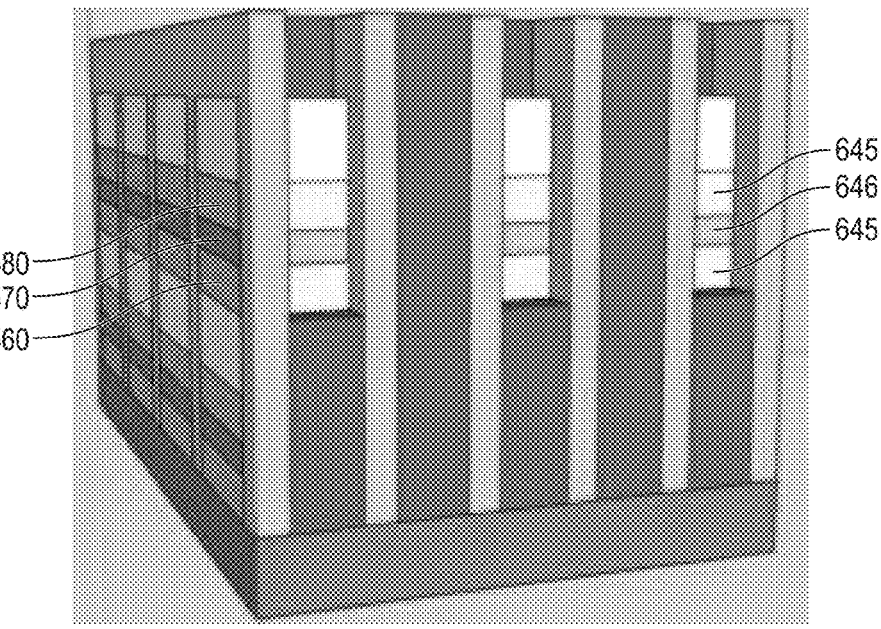

At block 255, according to one or more example embodiments, an oxide 646 is formed (e.g., grown) at the exposed sides of the upper channels 570 between the low-k spacers 645 formed at block 250, as illustrated in FIG. 9B. The oxide 646 isolates the upper channels 570 from contact/metal leads 670 (e.g., see FIGS. 12A through 12C) formed at block 280. In some embodiments, the exposed sides of the upper channels 570 may be partially etched back prior to forming the oxide 646, and thereafter, the oxide 646 may be formed therein. In some embodiments, a relatively thick oxide (e.g., about 3 nm) may be formed (e.g., grown) to cover the exposed sides of the upper channels 570 to form the oxide 646.

Figure 10:
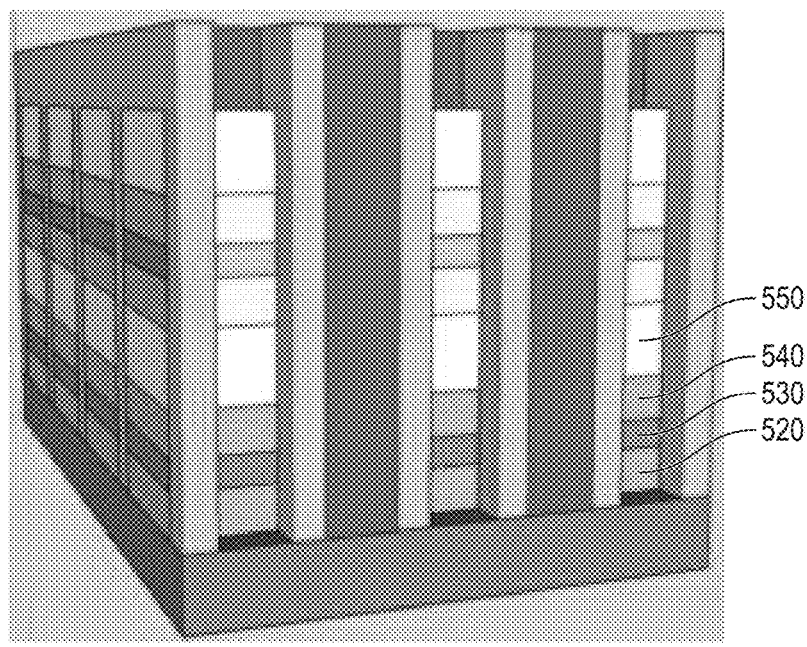

Then at block 260, as illustrated in FIG. 10, the remaining partially etched dummy fills 630 of every other source/drain trench are removed (e.g., etched) to expose the lower layers, for example, the first sacrificial layer 520, the first active layer 530, the second sacrificial layer 540, and the first low-k layer 550.

Figure 11A:
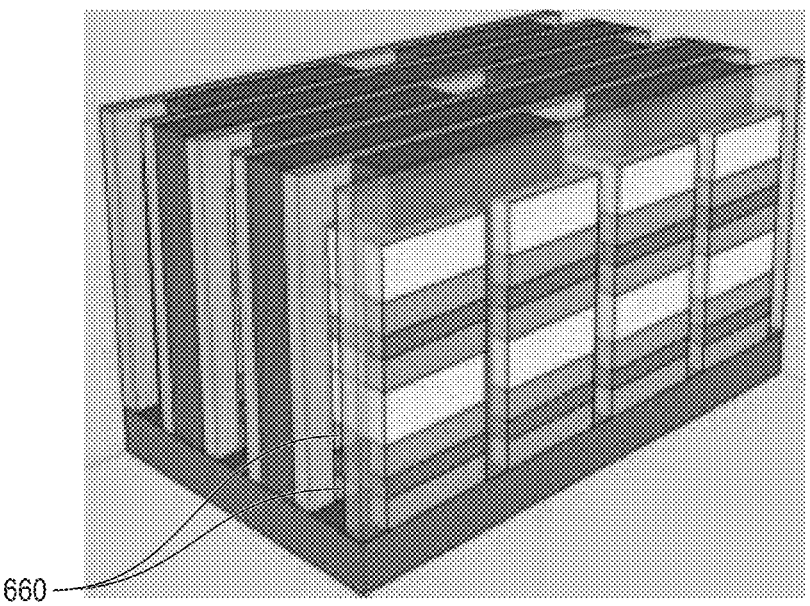
Figure 11B:
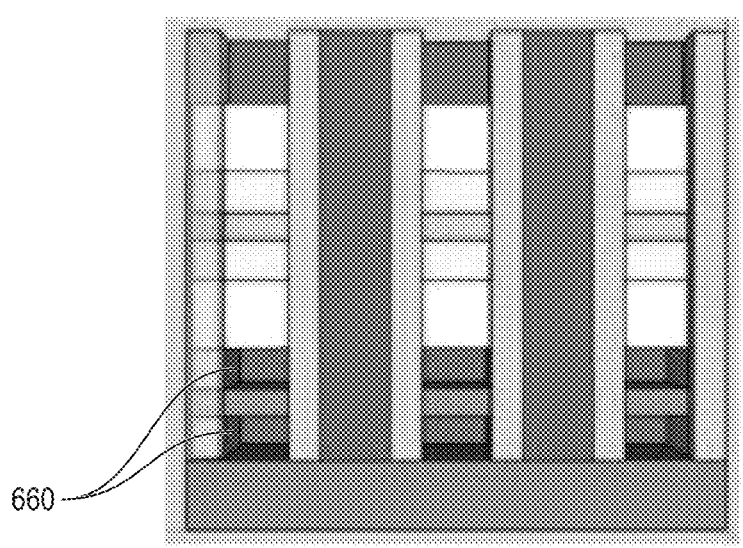
Figure 11C:
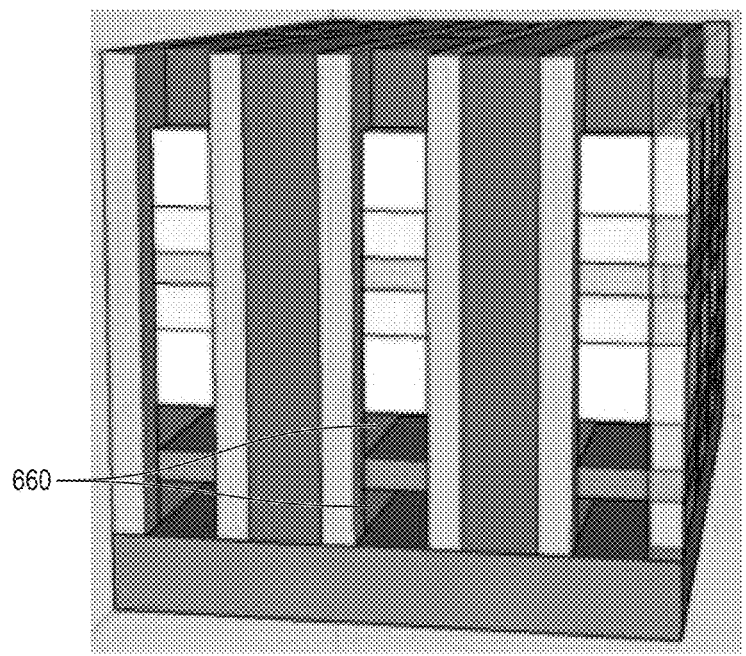
Figure 12A:
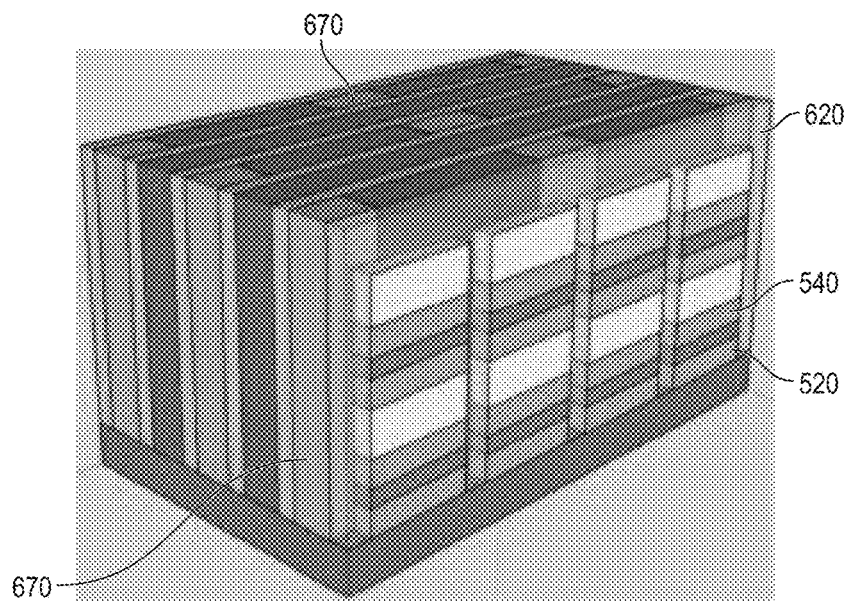
Figure 12B:
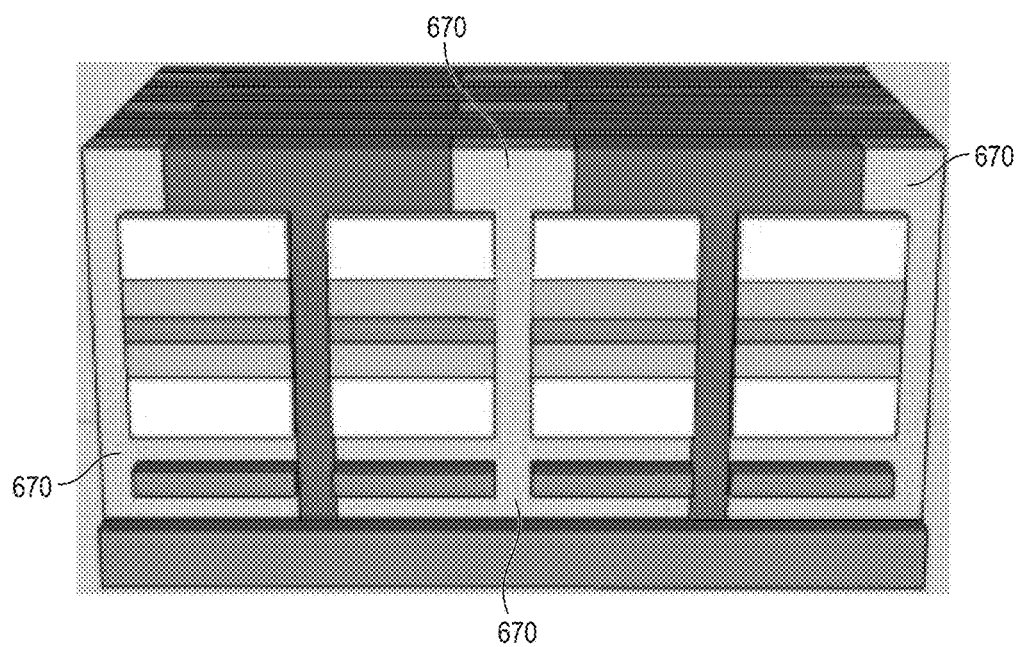
Figure 12C:
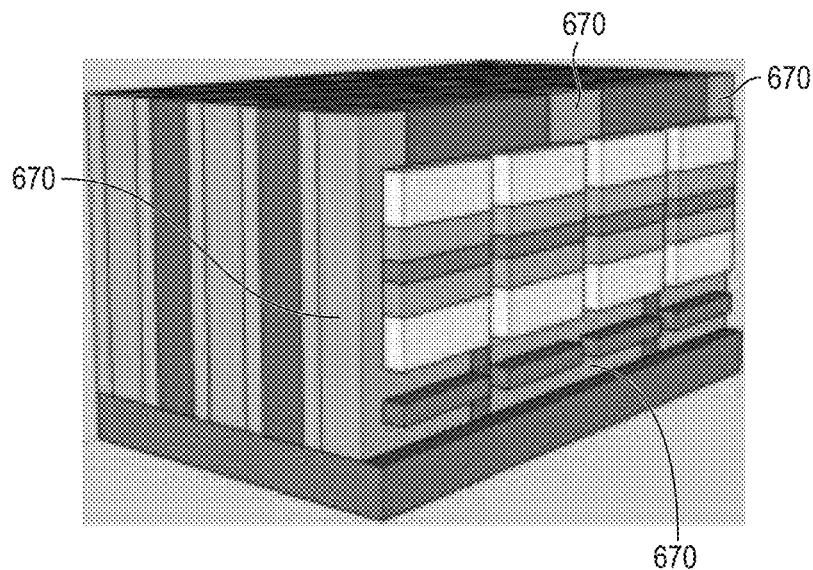

At block 270, according to one or more example embodiments, the lower sacrificial layers 520 and 540 are directionally etched to form openings or gaps 660 as illustrated in FIGS. 11A, 11B, and 11C, which respectively, are a perspective view, a side view, and a perspective side view of the superlattice structure after forming the openings or gaps 660 at block 270. Then at block 280, according to one or more example embodiments, the source and the drains are doped with N-type and/or P-type dopant materials as those skill in the art would appreciate, and contacts/metal leads 670 are formed (e.g., deposited) to form the first source/drains S/D1 of FIG. 2C, as illustrated in FIGS. 12A to 12C. FIG. 12A is a perspective view of the superlattice structure after forming the contacts/metal leads 670 at block 280. FIGS. 12B and 12C are front and perspective views, respectively, of the superlattice structure shown in FIG. 12A, but with a front spacer 620 and some of the remaining portions of the first and second sacrificial layers 520 and 540 omitted for clarity of illustration. However, in some embodiments, the front spacer 620 and some of the remaining portions of the first and second sacrificial layers 520 and 540 may be removed before or even after forming the contacts/metal leads 670 at block 280 depending on the process.

Figure 13A:
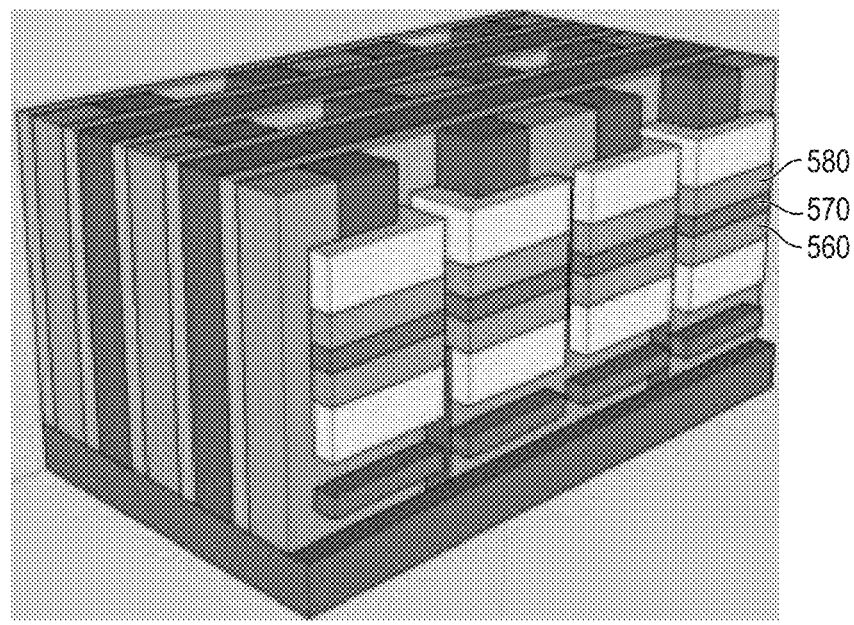
Figure 13B:
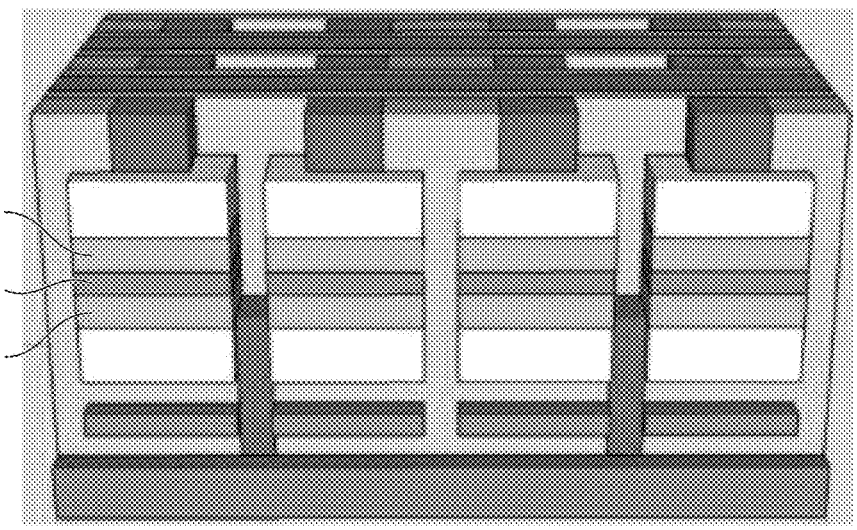
Figure 14A:
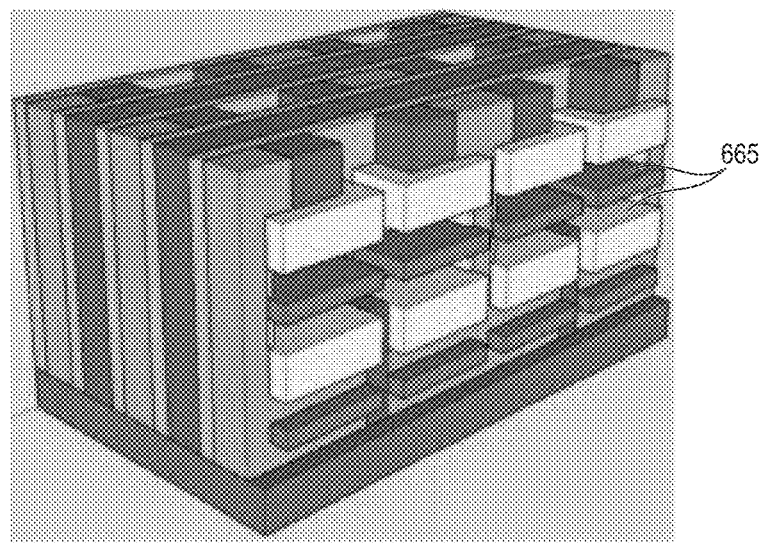
Figure 14B:
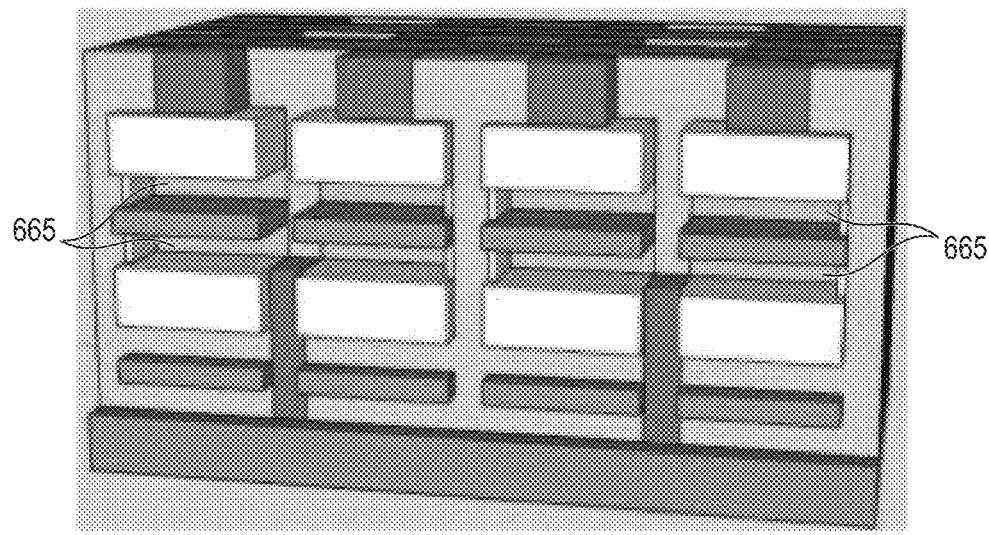
Figure 14C:
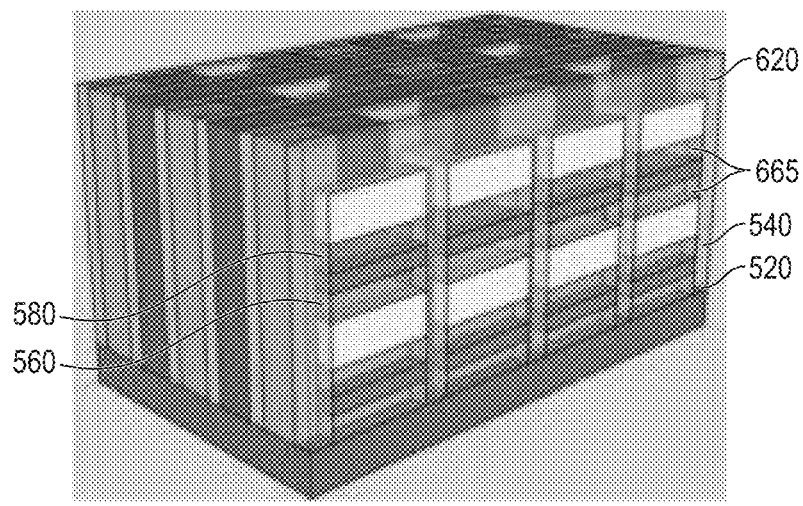

At block 290, according to one or more, example embodiments of the present invention, as illustrated in FIGS. 13A and 13B, the dummy fills 630 of the remaining source and drain trenches are partially etched to expose the third and fourth sacrificial layers 560 and 580 surrounding the upper channels (e.g., upper NS channels) 570 associated with the upper logic FETs. Then at block 300, according to one or more example embodiments of the present invention, as illustrated in FIGS. 14A to 14C, the sacrificial materials SM in the upper sacrificial layers 560 and 580 are directionally etched to form openings 665. For example, the sacrificial layers are directionally etched from trenches across the width of the upper channels (e.g., upper NS channels) 570. In one or more example embodiments, such etching uses an etch chemistry with sufficient directional selectivity (e.g., 100 vs 110) to limit the variation in the penetration of the etch toward the gate.

FIG. 14C is a perspective view of the superlattice structure after forming the openings 665 at block 300. FIGS. 14A and 14B are perspective and front views, respectively, of the superlattice structure shown in FIG. 14C, but with a front spacer 620 and some of the remaining portions of the first, second, third, and fourth sacrificial layers 520, 540, 560, and 580 omitted for clarity of illustration. However, in some embodiments, the front spacer 620 and some of the remaining portions of the first, second, third, and fourth sacrificial layers 520, 540, 560, and 580 may be removed before or even after forming the openings 665 at block 300.

Figure 15A:
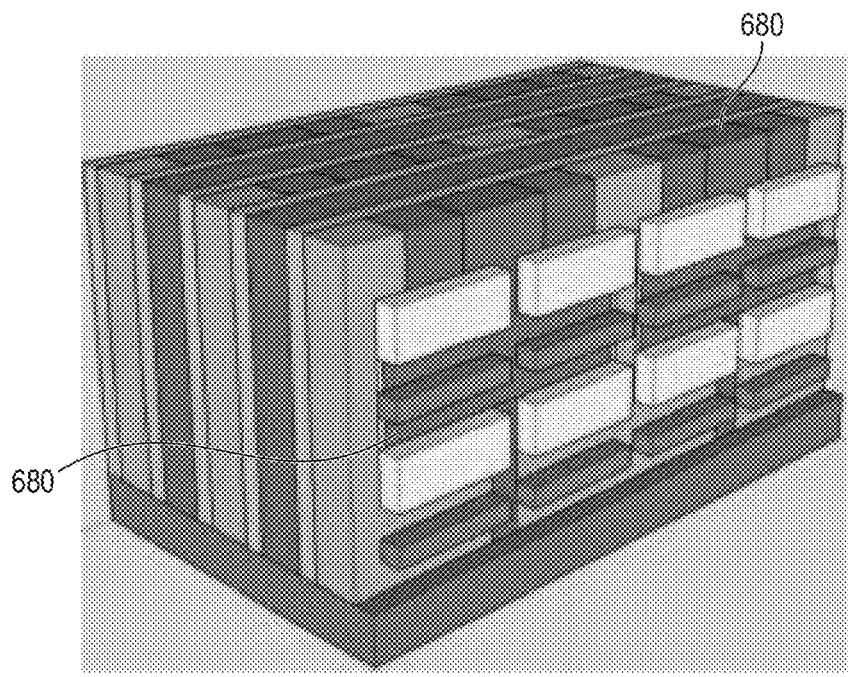
Figure 15B:
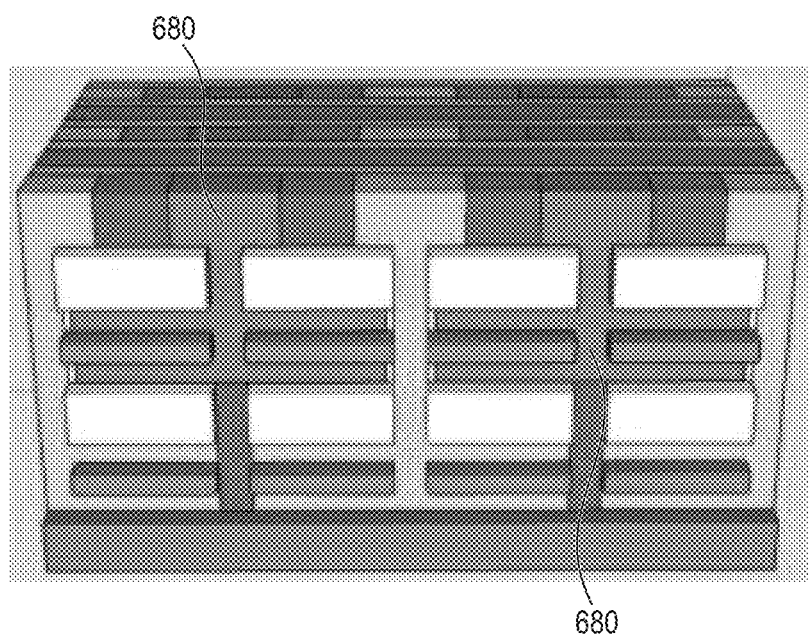
Figure 15C:
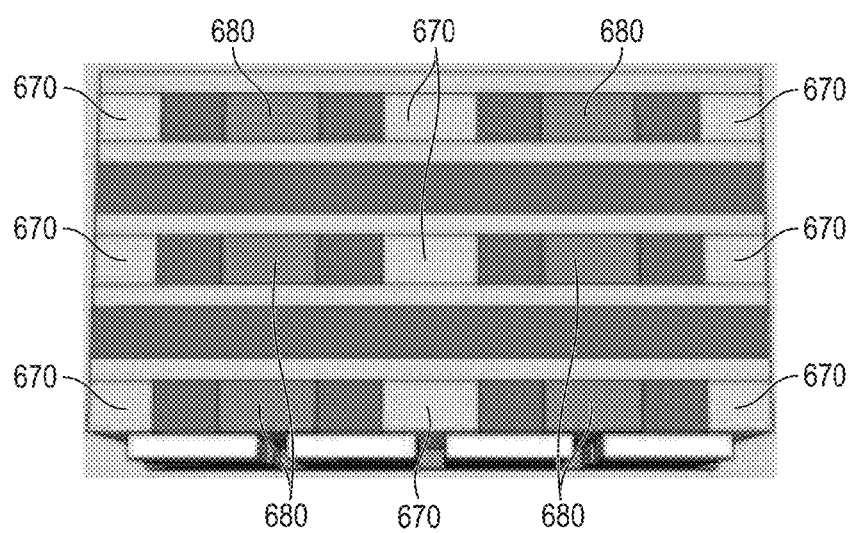

At block 310 according to one or more example embodiments of the present invention, sources/drains are doped with N-type and/or P-type dopant materials as those skilled in the art would appreciate, and contacts/metal leads 680 are formed (e.g., deposited) to from the second source/drains S/D2 of FIG. 2C, as illustrated in FIGS. 15A to 15C.

Accordingly, as shown in FIGS. 7A through 15C, the source/drains may be formed to include the first source drains S/D1 and the second source drains S/D2 to have fully independent source/drain contacts S/D1 and S/D2. However, as will be described in further detail with reference to FIGS. 15D through 15H, the source/drains may be formed to include common source/drain contacts S/D.

Figure 15D:
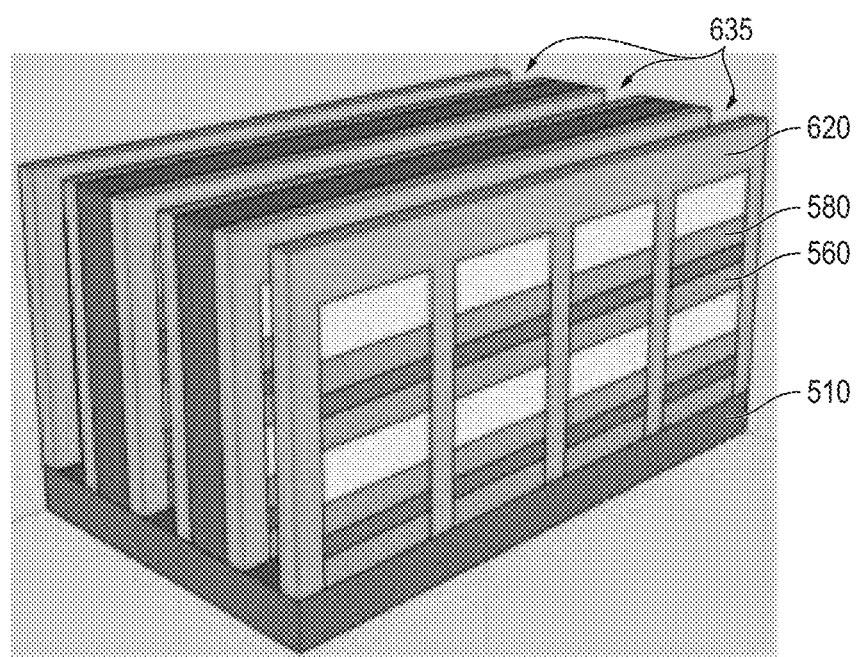
Figure 15E:
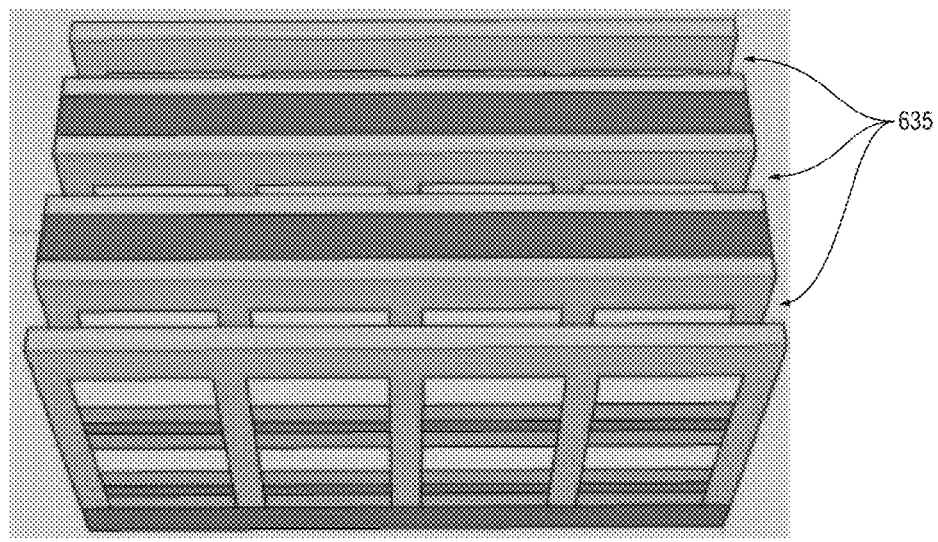
Figure 15F:
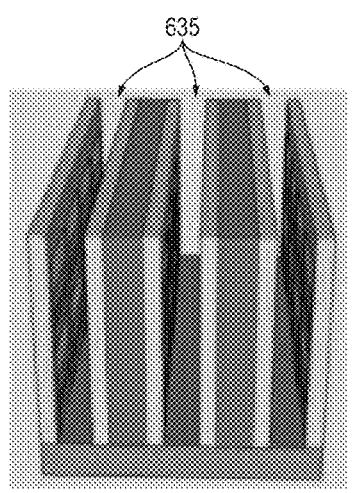

Referring back to FIGS. 3 and 6, after the spacers 620 and the dummy fills 630 have been deposited on the substrate 510 to fill the trenches 600 (e.g., see FIG. 5) with the dummy fills 630 between the spacers 620 as shown in FIG. 6, instead of blocks 230 through 300 of FIG. 3, the entire source/drain regions are etched (e.g., directionally etched) including the dummy spacers 630, and portions of each of the first sacrificial layer 520, the first active layer 530, the second sacrificial layer 540, the first low k layer 550, the third sacrificial layer 560, the second active layer 570, the fourth sacrificial layer 580, and the second low k layer 590, as shown in FIGS. 15D through 15F, which are respectively, a prospective view, a top view, and a side view.

Figure 15G:
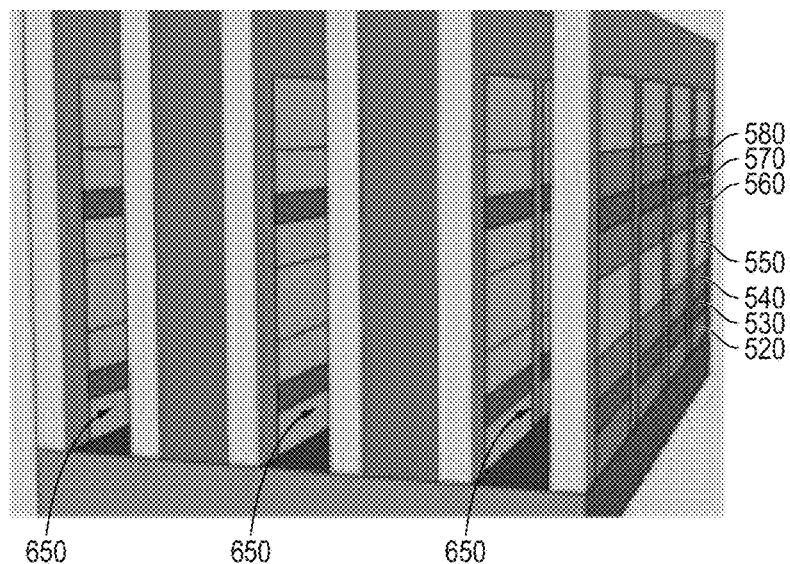

Then, the sacrificial materials of the exposed surface of each of the first through fourth sacrificial layers 520, 540, 560, and 580 are partially etched back, and a low-k spacer material 650 is deposited thereon to reduce capacitance between the gates and the source/drains, as shown in FIG. 15G.

Figure 15H:
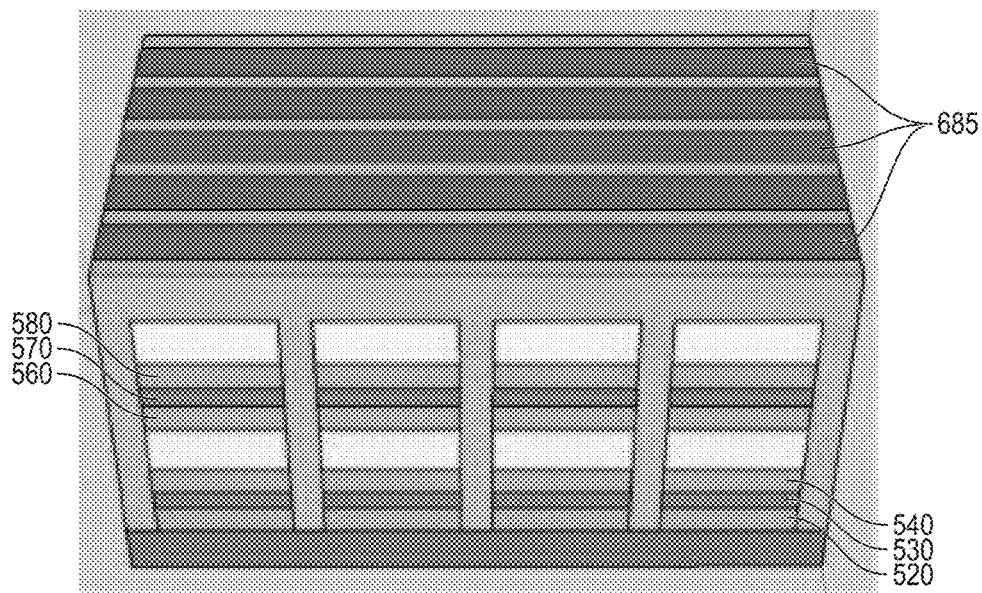

The sources/drains are doped with N-type and/or P-type dopant materials as those skilled in the art would appreciate, and contacts/metal leads 685 are formed (e.g., deposited) to from the common source/drains S/D of FIG. 2F, as illustrated in FIG. 15H.

For convenience, FIGS. 16A through 26B illustrate forming of the first and second gates G1 and G2 for the SICFET device shown in FIGS. 2A through 2C, but the process for forming the first and second gates G1 and G2 for the SICFET device shown in FIGS. 2D through 2F is the same or substantially the same thereto, and thus, repeated description will be omitted.

In FIGS. 16A through 26B, the source/drain electrodes S/D1 and S/D2 at the front (e.g., shown in FIGS. 15A through 15C) are not shown to better illustrate the formation of the gate electrodes as shown in the cross-sectional view of FIG. 2B, for example.

Figure 16A:
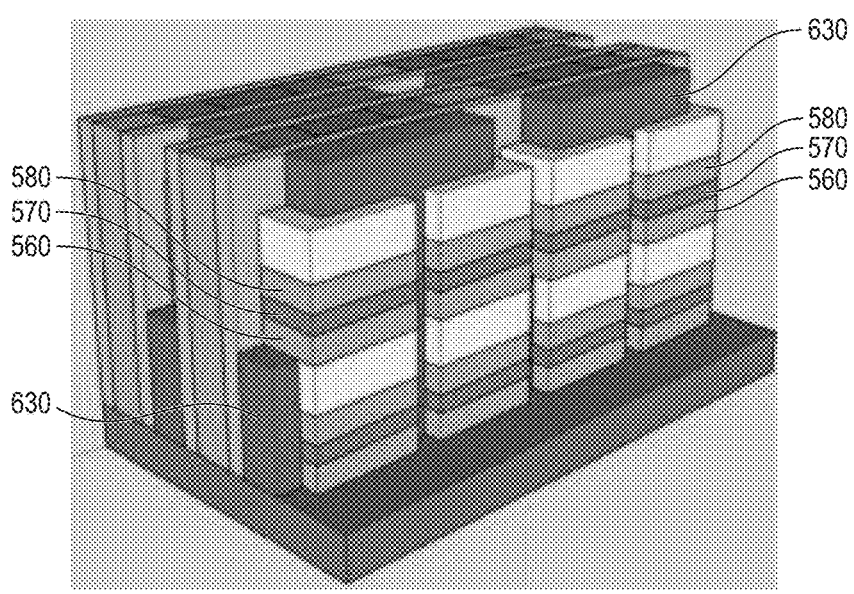
Figure 16B:
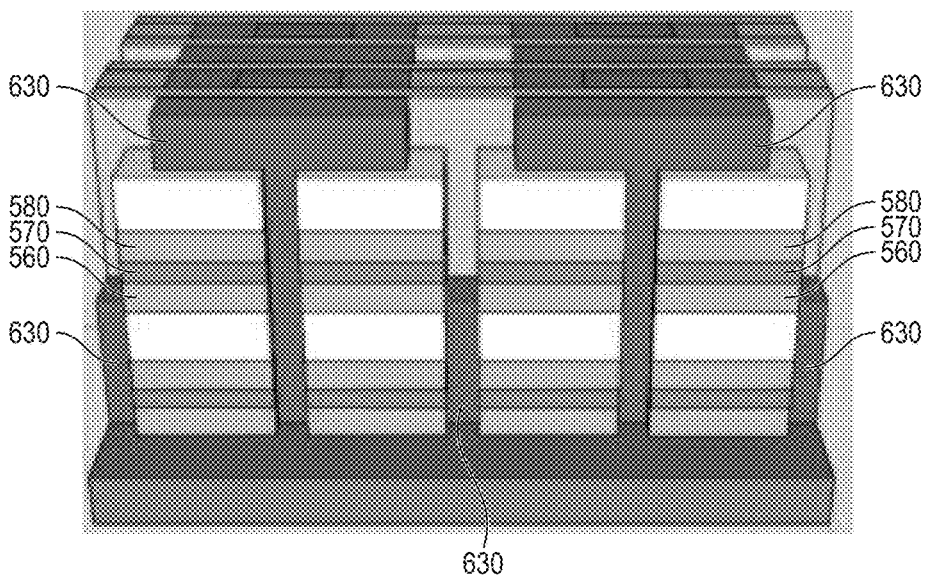

At block 320, according to one or more example embodiments of the present invention, the dummy fills 630 of every other gate trench is partially etched as illustrated in FIGS. 16A to 16B, which respectively, are a perspective view and a front view of the superlattice structure after the partial etching in step 320. In one or more example embodiments, the structure is etched to expose all the sacrificial materials 560 and 580 surrounding the upper channels (e.g., upper NS channels) associated with the upper logical FETs for the every other gate trench. As illustrated in FIGS. 16A and 16B, the dummy fills 630 have been partially etched to expose the sacrificial materials 560 and 580 for every other gate trench.

Figure 17A:
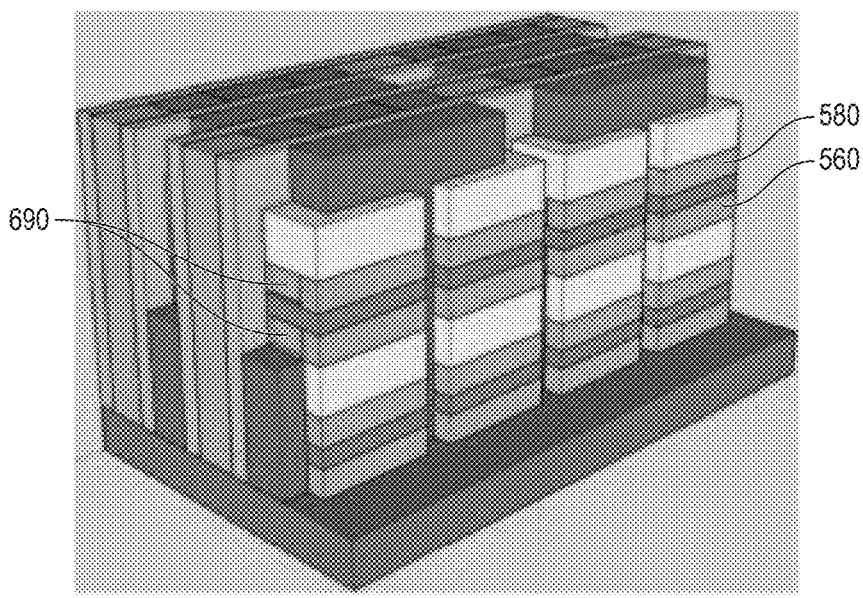
Figure 17B:
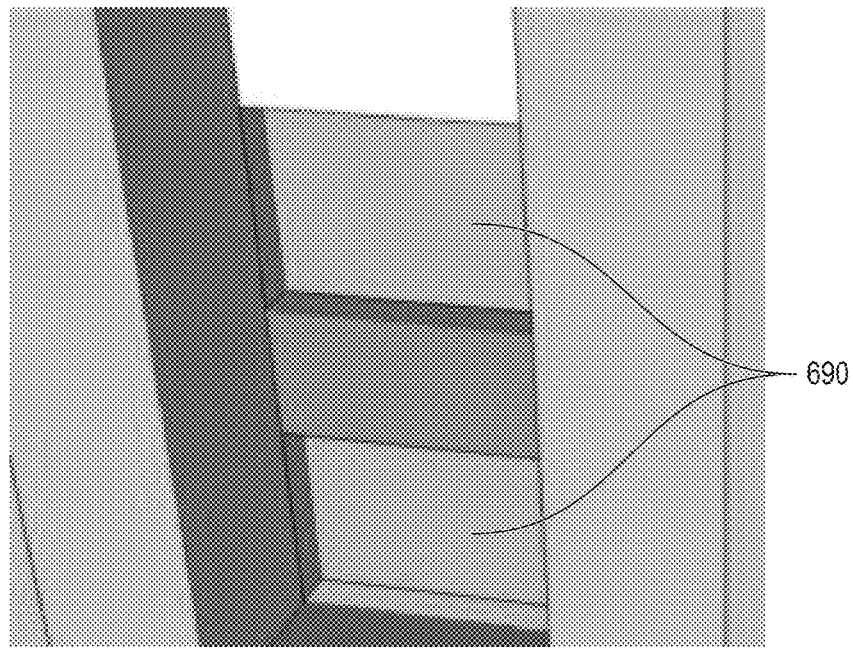

At block 330 according to one or more example embodiments, the sacrificial materials SM in the upper sacrificial layers 560 and 580 that have been exposed at block 320 are partially etched back to form depressed or indented portions (e.g., groove portions) 690 as illustrated in FIGS. 17A and 17B, which respectively, are a perspective view and a partial side view of the superlattice structure. The groove portions 690 may be formed, for example, to make room for a low-k spacer to reduce capacitance between the stacked gates (or gate electrodes).

Figure 18:
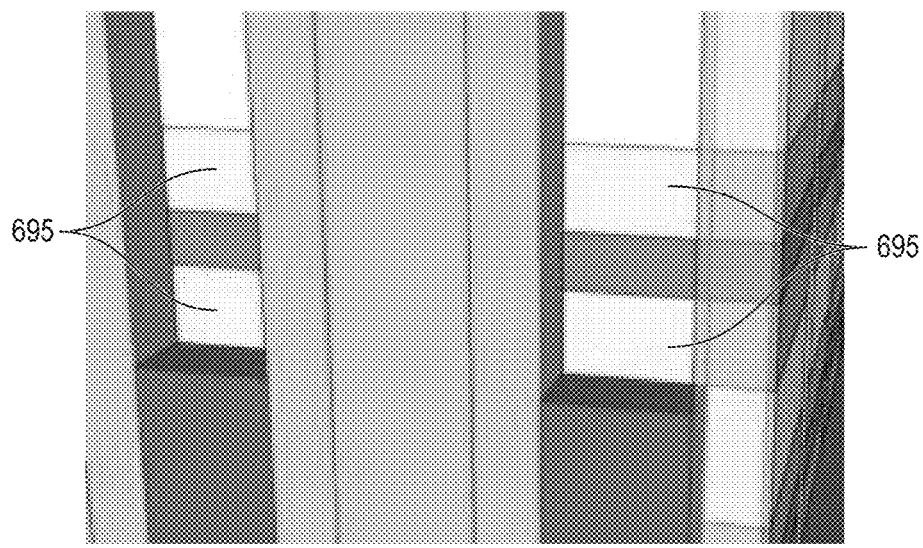

At block 340, according to one or more example embodiments, the low-k material is formed (e.g., grown) in the corresponding trenches to fill the partially etched back groove portions 690 of the third and fourth sacrificial layers 560 and 580, and then etched back to be flush to the side of the corresponding trenches to form the low-k spacers 695 in the groove portions 690 as shown in FIG. 18, which is a partial side view of the superlattice structure. Unlike that shown in FIG. 9B, accordingly to some embodiments, an oxide may not be formed on the exposed sides of the upper channels 570 between the low-k spacers 695, because a dielectric may be introduced during the RMG process to isolate the upper channels 570 from the contact/metal fills to the bottom channels. However, the present invention is not limited thereto, and in some embodiments, it may be desirable to form an oxide on the exposed sides of the upper channels 570 similar to that shown in FIG. 9B to improve device characteristics, for example, by reducing parasitic capacitance Cpara (e.g., between the upper channel to S/D metal to lower channel).

Figure 19:
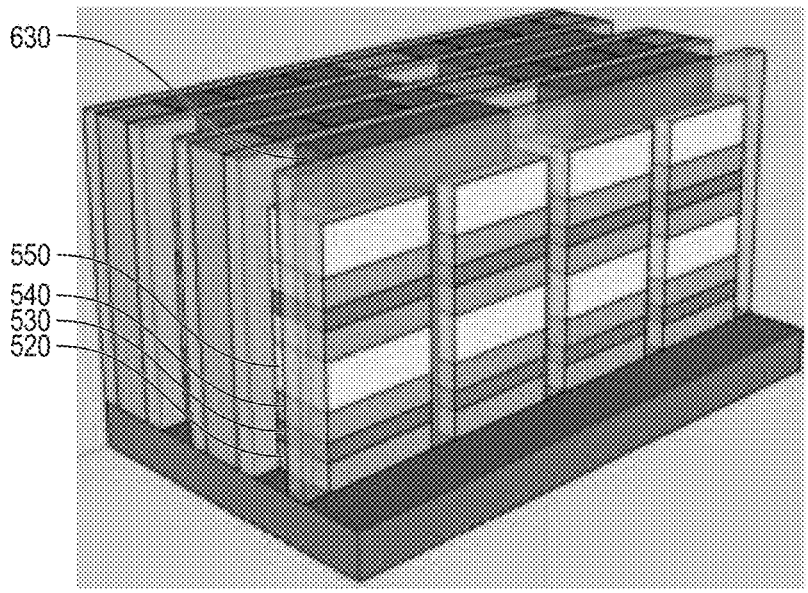

Then at block 350, as illustrated in FIG. 19, the remaining partially etched dummy fills 630 of every other gate trench are removed (e.g., etched) to expose the lower layers, for example, the first sacrificial layer 520, the first active layer 530, the second sacrificial layer 540, and the first low-k layer 550.

Figure 20A:
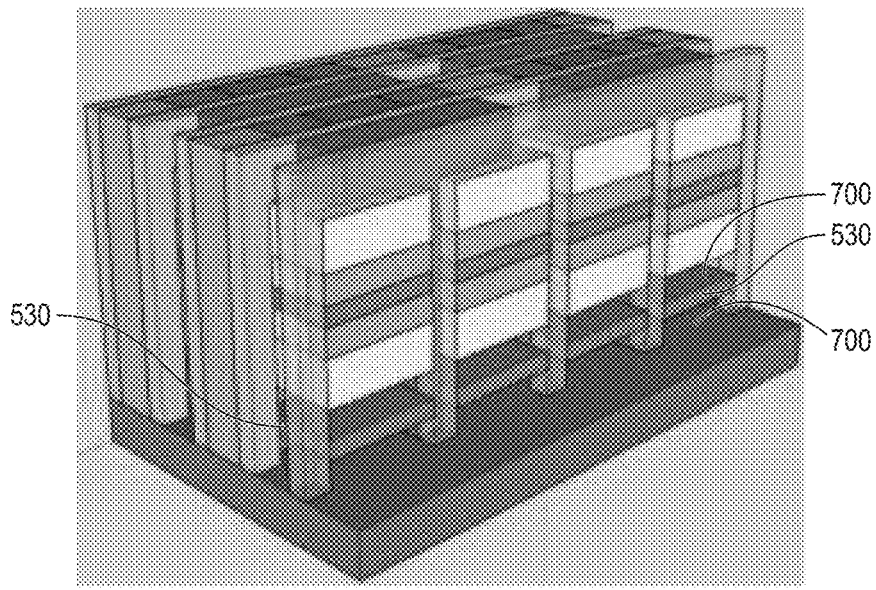
Figure 20B:
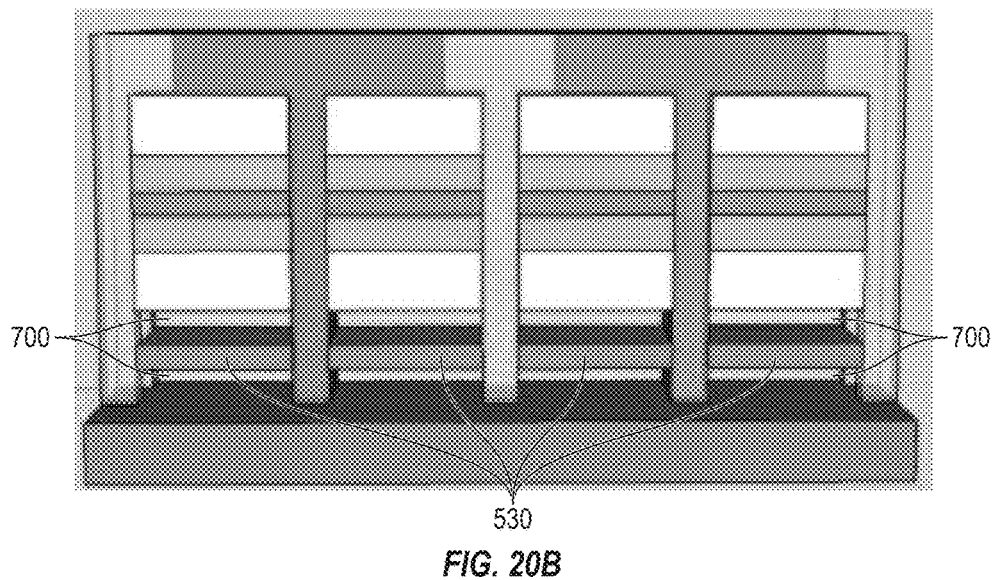
Figure 21:
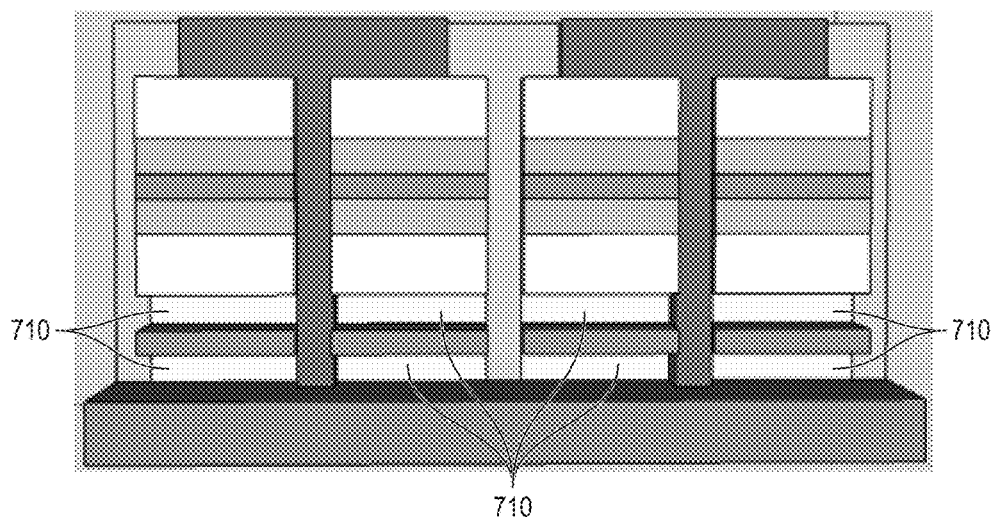

At block 360, according to one or more example embodiments of the present invention, the first and second sacrificial layers 520 and 540 surrounding the lower channels (e.g., lower NS channels) 530 are removed through etching (e.g., directional etching) to form openings 700, as illustrated in FIGS. 20A and 20B, which respectively, are a perspective view and a front view of the superlattice structure after forming the openings 700 at block 360. Then at block 370, according to one or more example embodiments, as illustrated in FIG. 21, oxides 710 are selectively formed on the metal exposed by the openings 700 to reduce capacitances Cgd and/or Cgs. According to one or more embodiments of the present invention, the oxides 710 may include any suitable material having a suitably low dielectric constant value, for example, such as $SiO_2$.

Figure 22A:
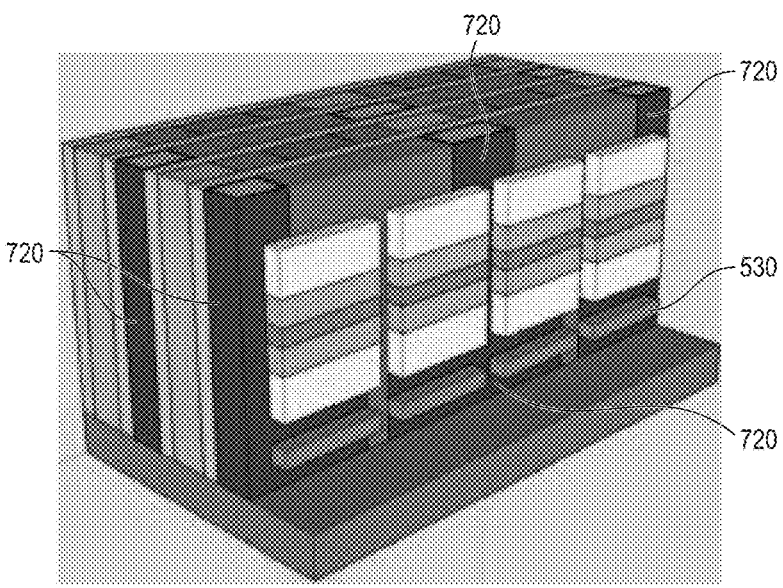
Figure 22B:
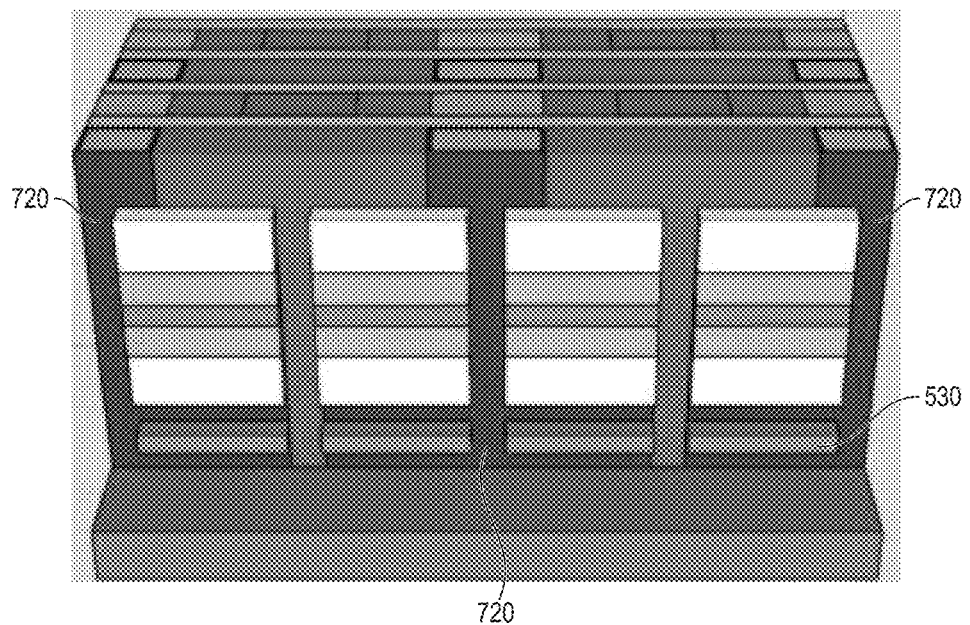

At block 380, according to one or more example embodiments of the present invention, gate metal 720 is formed (e.g., deposited), as illustrated in FIGS. 22A and 22B, for the lower channels (e.g., NS channels) 530 to form the first gates G1 (e.g., see FIG. 2B).

Figure 23A:
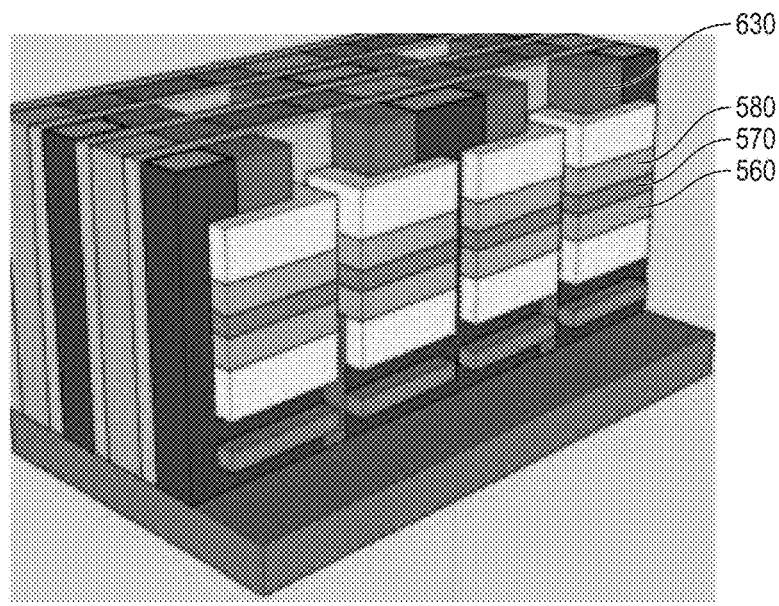
Figure 23B:
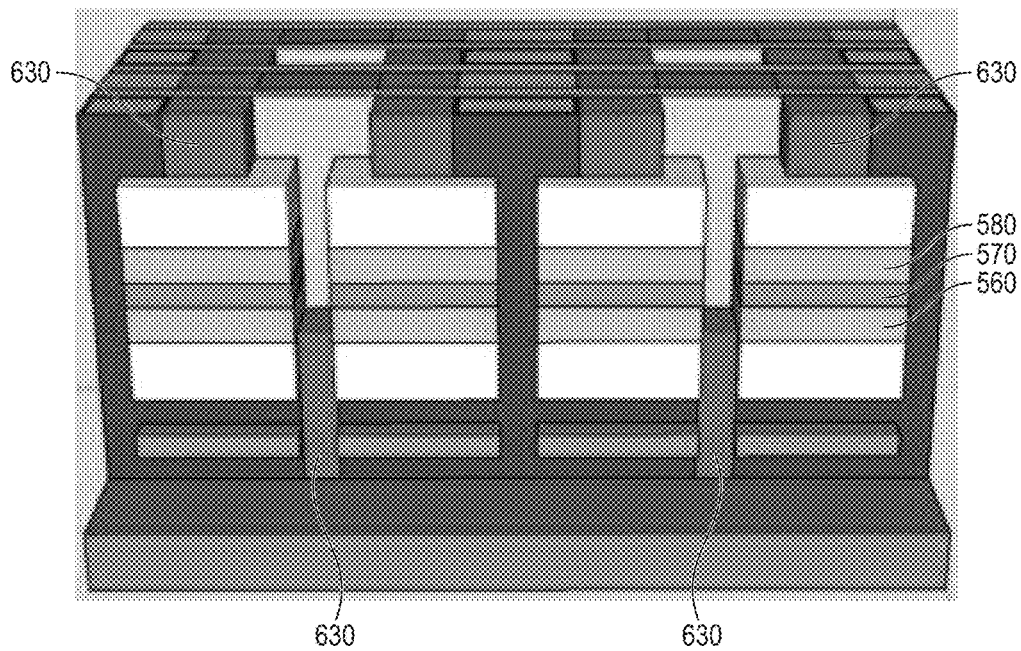

At block 390, according to one or more example embodiments, the dummy fills 630 in the remaining gate trenches are partially etched as shown in FIGS. 23A and 23B to expose the third and fourth sacrificial layers 560 and 580 surrounding the upper channels (e.g., upper NS channels) 570 associated with the upper logic FETs.

Figure 24A:
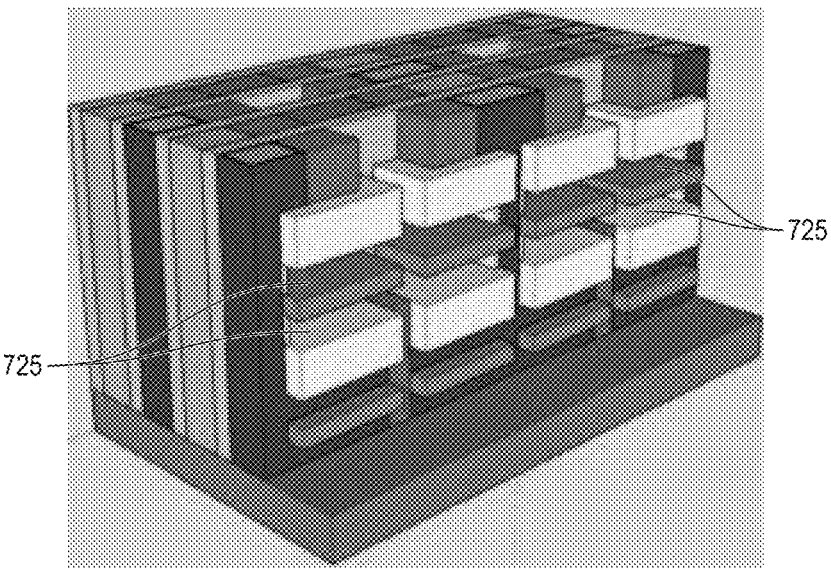
Figure 24B:
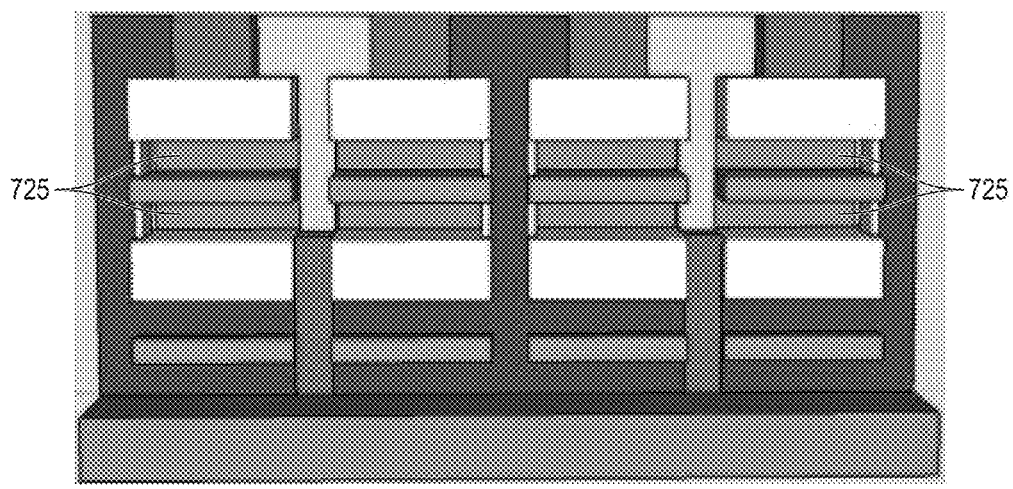

At block 400, according to one or more example embodiments, as illustrated in FIGS. 24A and 24B, the remaining sacrificial materials SM in the upper sacrificial layers 560 and 580 are etched (e.g., directionally etched) to form openings 725.

Figure 25:
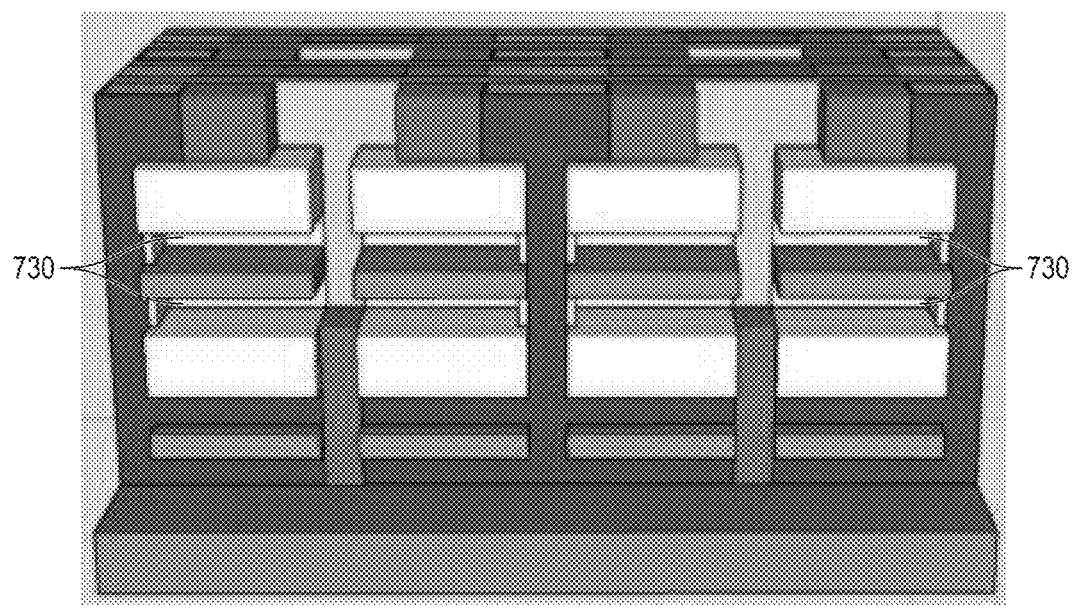

At block 410, according to one or more example embodiments according to the present invention, as illustrated in FIG. 25, selective low-k material 730 is formed (e.g., directly formed or grown) on the source/drain metals that have been exposed from the openings 725.

Figure 26A:
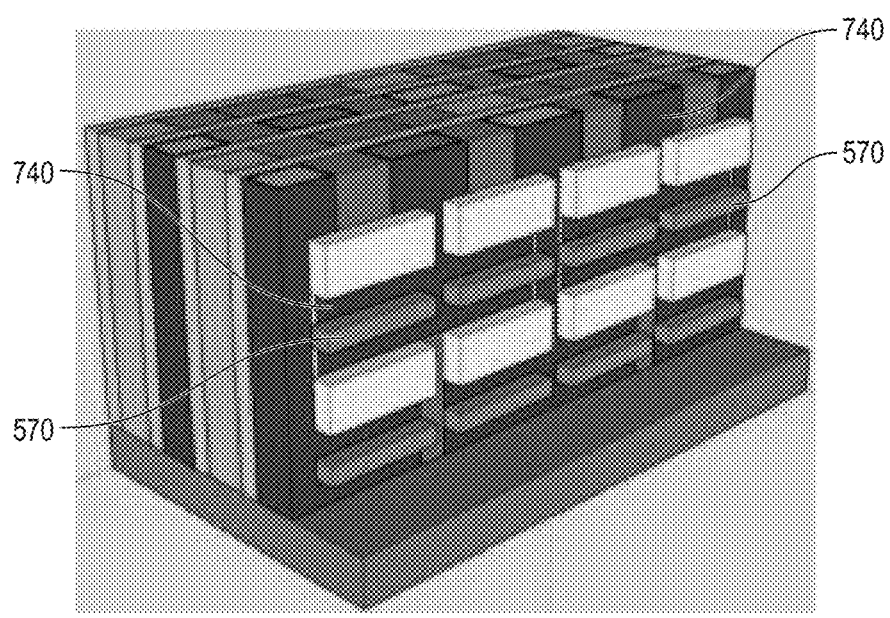
Figure 26B:
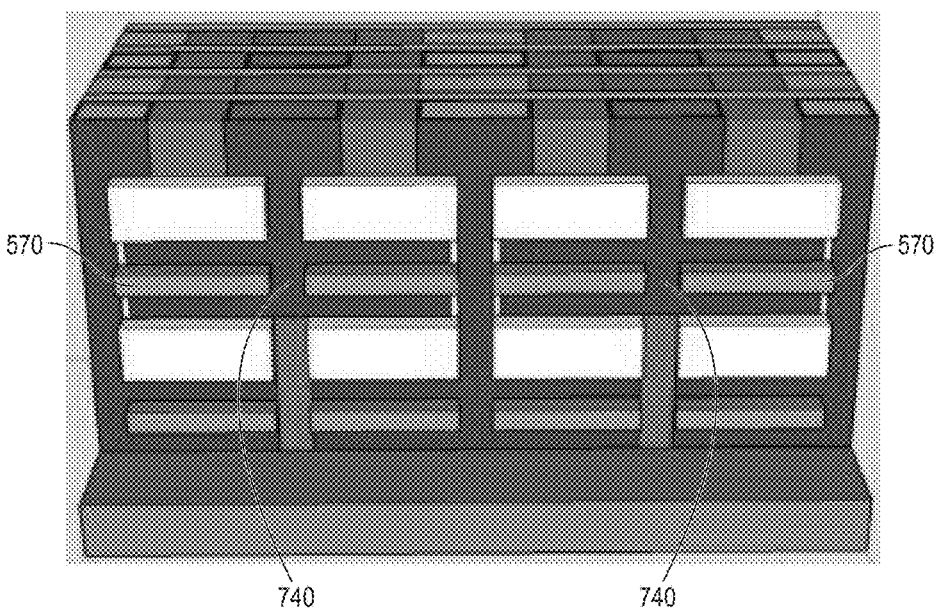

At block 420, according to one or more example embodiments, as illustrated in FIGS. 26A and 26B, gate metal 740 is formed to correspond to the upper channel layers (e.g., upper NS channels) 570 to form the second gates G2 (e.g., see FIG. 2B).

Figure 27A:
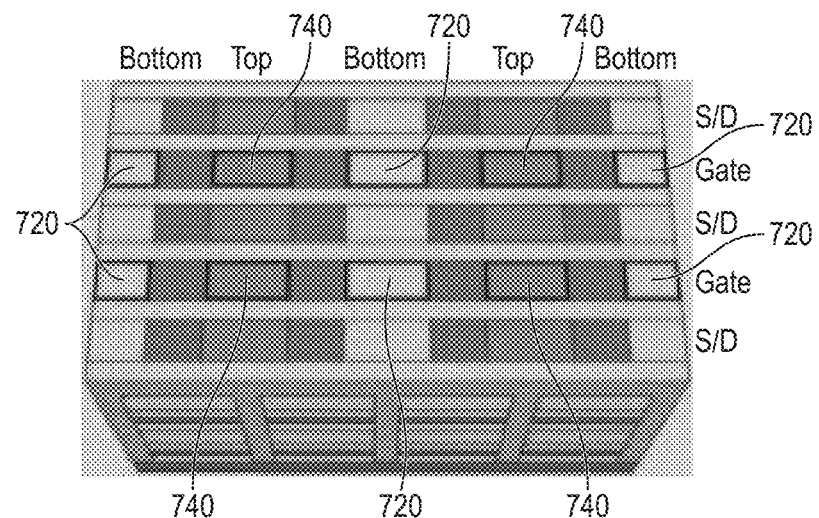
Figure 27B:
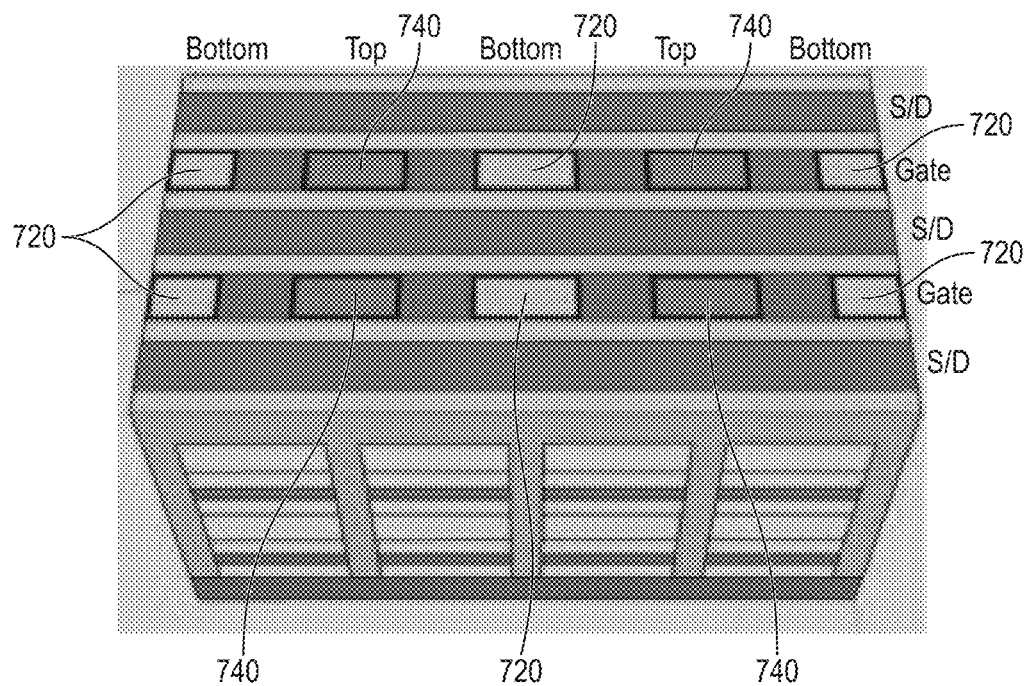

Accordingly, as shown in FIGS. 27A and 27B, the first gates G1 and the second gates G2 may be formed with the gate metals 720 and 740, respectively.

Hereinafter, various applications of the above described SICFET as applied to various different logic circuits will be described with reference to FIGS. 28 through 36B.

Figure 28:
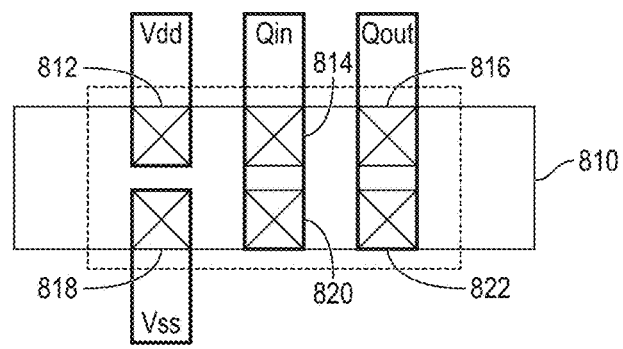
FIG. 28 illustrates a notional layout of a 2T inverter in a 1T cell according to one or more example embodiments of the present invention.

FIG. 28 illustrates a notional layout of a 2T inverter in a 1T cell according to one or more example embodiments of the present invention. Referring again to the nanosheet stack 10 in FIG. 1A, to implement the 2T inverter, the first channel 25 may include one of an NMOS layer and a PMOS layer, and the second channel 35 may include the other one of the NMOS layer and the PMOS layer. For example, when the first channel 25 includes the NMOS layer, the second channel 35 includes the PMOS layer. Accordingly, the 2T inverter is the exception where NMOS and PMOS are co-integrated in the same stack, and the cell height is determined by the thickness of one nanosheet stack instead of two nanosheet stacks.

Referring to FIG. 28, a nanosheet stack 810 includes both the NMOS and PMOS layers. A first contact 812 is a source contact of the PMOS layer and is coupled to a first power source Vdd. A second contact 814 is a gate contact of the PMOS layer and is coupled to an input terminal Qin of the 2T inverter. A third contact 816 is a drain contact of the PMOS layer and is coupled to an output terminal Qout of the 2T inverter. A fourth contact 818 is a source contact of the NMOS layer and is coupled to a second power source Vss. Fifth and sixth contacts 820 and 822 are a gate contact and a drain contact, respectively, of the NMOS layer.

Figure 29A:
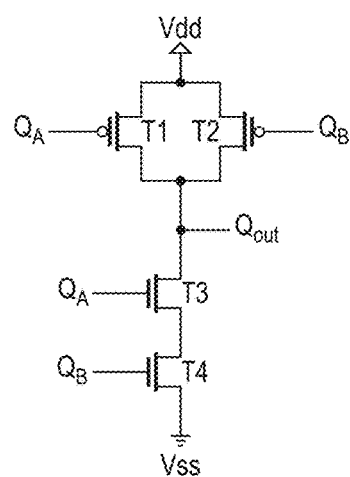
FIGS. 29A-29B illustrate a 2-input NAND in a 2T cell according to one or more example embodiments of the present invention.
Figure 29B:
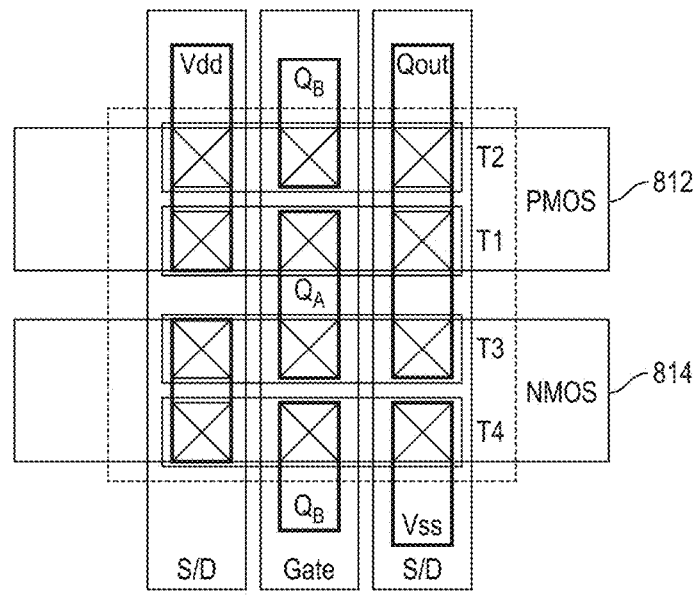

FIGS. 29A-29B illustrate a 2-input NAND in a 2T cell according to one or more example embodiments of the present invention. FIG. 29A is an equivalent circuit diagram of the 2-input NAND, and FIG. 29B is a corresponding notional layout of a top view of contacts of the 2-input NAND implemented with SICFETs according to an embodiment of the present invention.

As shown in FIGS. 29A and 29B, the 2-input NAND includes transistors T1 through T4. Transistors T1 and T2 may be PMOS transistors, and thus, may be formed with a nanosheet stack 812 having PMOS layers. Transistors T3 and T4 may be NMOS transistors, and thus, may be formed with a nanosheet stack 814 having NMOS layers. If fabrication allows, it may be possible to merge three of the four S/D regions (e.g., other than the S/D region connected to the Vss contact) in this circuit and eliminate or reduce MOL wiring.

Figure 30A:
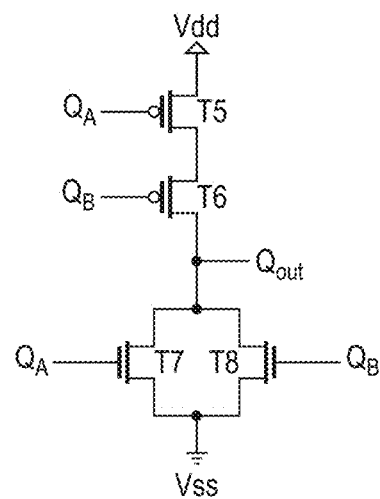
FIGS. 30A-30B illustrate a 2-input NOR in a 2T cell according to one or more example embodiments of the present invention.
Figure 30B:
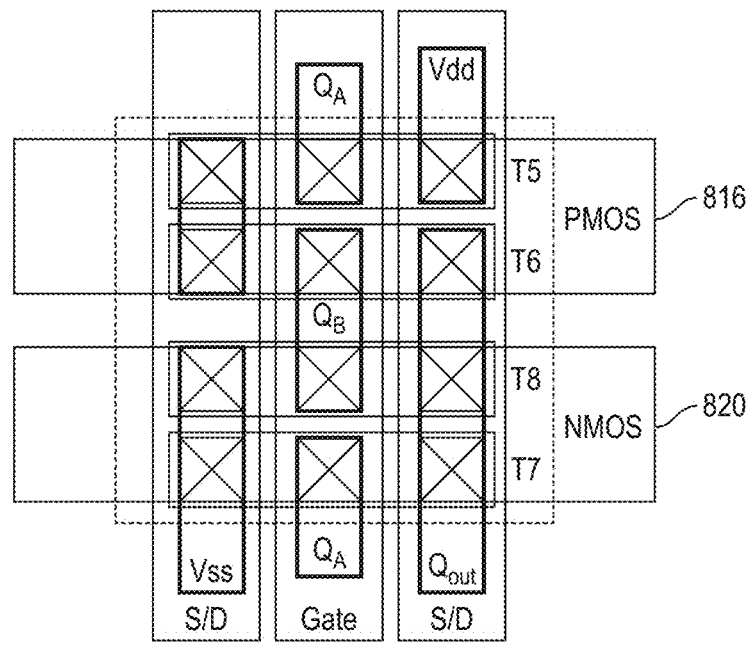

FIGS. 30A-30B illustrate a 2-input NOR in a 2T cell according to one or more example embodiments of the present invention. FIG. 30A is an equivalent circuit diagram of the 2-input NOR, and FIG. 30B is a corresponding notional layout of a top view of contacts of the 2-input NOR implemented with SICFETs according to an embodiment of the present invention.

As shown in FIGS. 30A and 30B, the 2-input NOR includes transistors T5 through T8. Transistors T5 and T6 may be PMOS transistors, and thus, may be formed with a nanosheet stack 816 having PMOS layers. Transistors T7 and T8 may be NMOS transistors, and thus, may be formed with a nanosheet stack 820 having NMOS layers. If fabrication allows, it may be possible to merge three of the four S/D regions (e.g., other than the S/D region connected to the Vdd contact) in this circuit and eliminate or reduce MOL wiring.

Figure 31A:
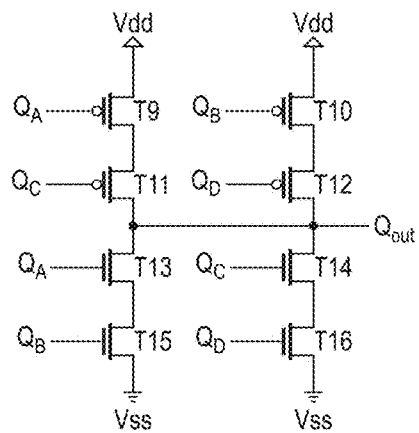
FIGS. 31A-31B illustrate a 221 AOI in a 4T cell according to one or more example embodiments of the present invention.
Figure 31B:
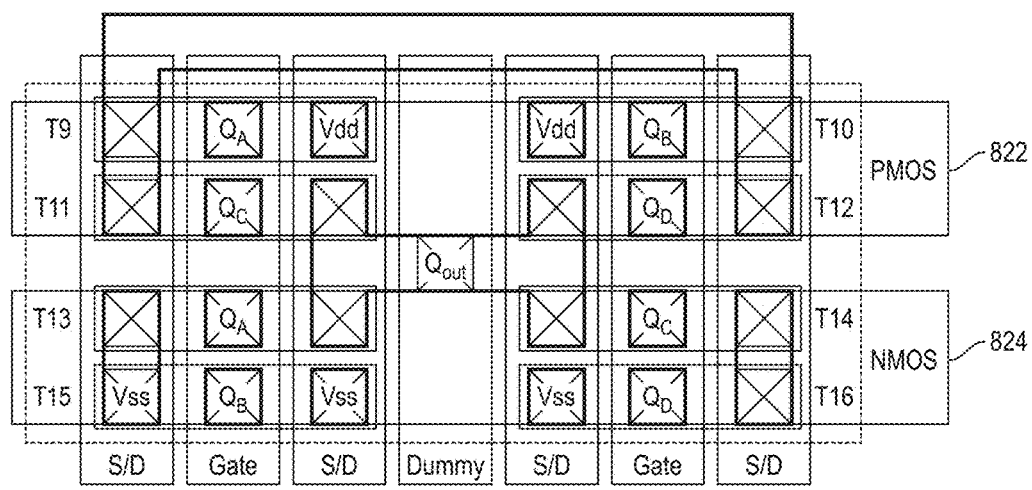

FIGS. 31A-31B illustrate a 221 AOI in a 4T cell according to one or more example embodiments of the present invention. FIG. 31A is an equivalent circuit diagram of the 221 AOI, and FIG. 31B is a corresponding notional layout of a top view of contacts of the 221 AOI implemented with SICFETs according to an embodiment of the present invention.

As shown in FIGS. 31A and 31B, the 221 AOI includes transistors T9 through T16. Transistors T9 through T12 may be PMOS transistors, and thus, may be formed with a nanosheet stack 822 having PMOS layers. Transistors T13 through T16 may be NMOS transistors, and thus, may be formed with a nanosheet stack 824 having NMOS layers.

Figure 32A:
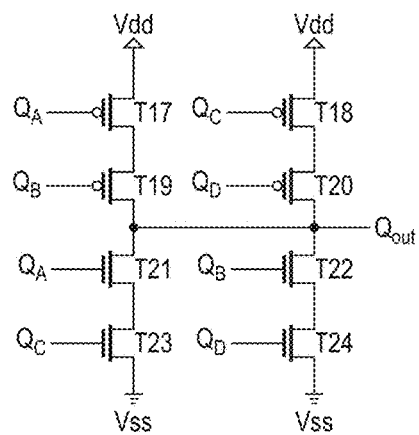
FIGS. 32A-32B illustrate a 221 OAI in a 4T cell according to one or more example embodiments of the present invention.
Figure 32B:
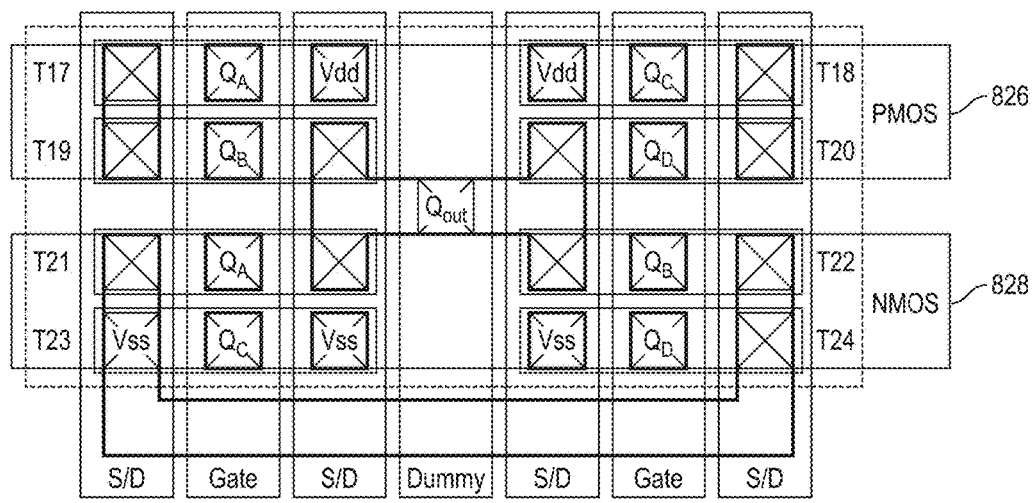

FIGS. 32A-32B illustrate a 221 OAI in a 4T cell according to one or more example embodiments of the present invention. FIG. 32A is an equivalent circuit diagram of the 221 AOI, and FIG. 32B is a corresponding notional layout of a top view of contacts of the 221 AOI implemented with SICFETs according to an embodiment of the present invention.

As shown in FIGS. 32A and 32B, the 221 AOI includes transistors T17 through T24. Transistors T17 through T20 may be PMOS transistors, and thus, may be formed with a nanosheet stack 826 having PMOS layers. Transistors T21 through T24 may be NMOS transistors, and thus, may be formed with a nanosheet stack 824 having NMOS layers.

Figure 33A:
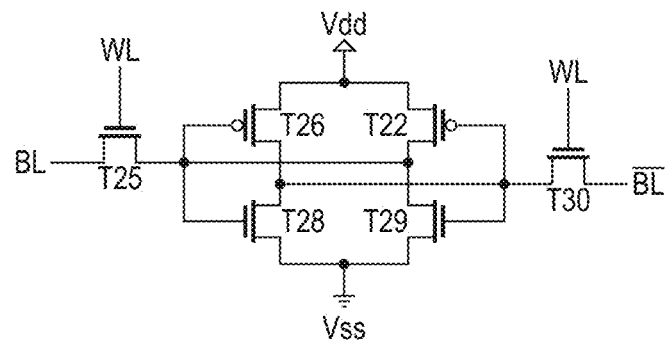
FIGS. 33A-33E illustrate a 6T SRAM in a 3T cell according to one or more example embodiments of the present invention.
Figure 33B:
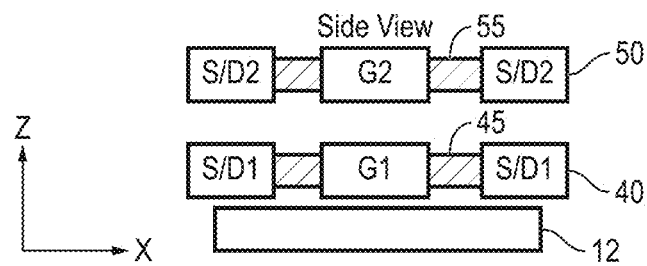
Figure 33C:
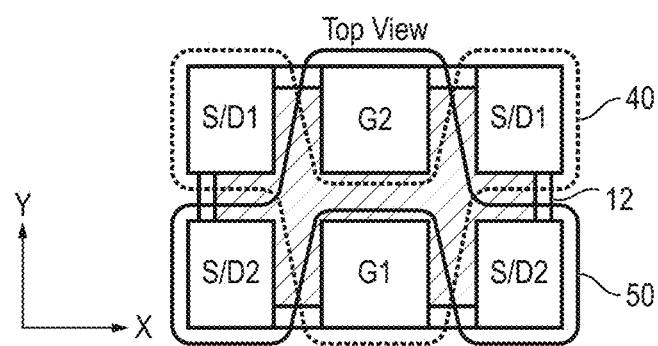
Figure 33D:
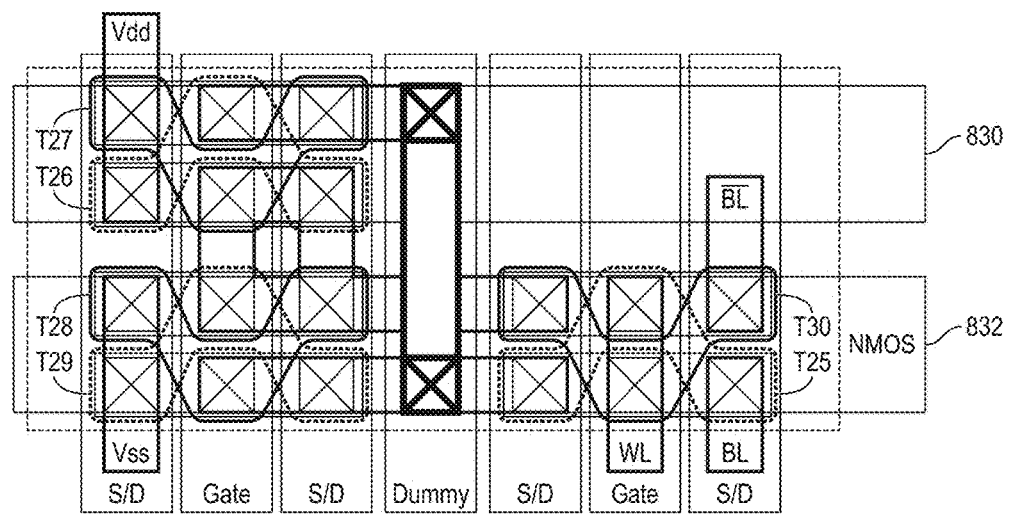

FIGS. 33A-33E illustrate a 6T SRAM in a 3T cell according to one or more example embodiments of the present invention. FIG. 33A is an equivalent circuit diagram of the 6T SRAM, FIG. 33B is a conceptual diagram of a side view of contacts of a nanosheet stack used for implementing the 6T SRAM, FIG. 33C is a conceptual diagram of a top view of contacts of the nanosheet stack used for implementing the 6T SRAM, FIG. 33D is a corresponding notional layout of a top view of contacts of the 6T SRAM implemented with the nanosheet stacks shown in FIGS. 33B and 33C according to an embodiment of the present invention, and 33E is a corresponding notional layout of a top view of contacts of the 6T SRAM, which is an alternate layout, implemented with the nanosheet stacks shown in FIGS. 33B and 33C according to an embodiment of the present invention.

Referring to FIGS. 33B and 33C, the nanosheet stack includes two field effect transistors (FETs) 40 and 50 that are formed at two separate nanosheets on a substrate (e.g., a bottom oxide) 12 that are offset from each other along a vertical direction (e.g., along a Z-axis direction). According to one or more embodiments, the substrate 12 may be any suitable crystalline material suitable for epitaxial (e.g., single crystal) growth, for example, silicon, SiGe, etc.

A first FET (e.g., a lower FET) 40 includes a first source S1, a first gate G1, and a first drain D1 that are arranged along a horizontal direction (e.g., along an X-axis direction), wherein the gate G1 is configured to control a first channel 45. The first FET 40 may have fully independent source, gate, and drain contacts, each on top and side surfaces.

A second FET (e.g., an upper FET) 50 includes a second source S2, a second gate G2, and a second drain D2 that are arranged along the horizontal direction, wherein the second gate G2 is configured to control a second channel 55. The second FET 50 may have fully independent source, gate, and drain contacts, each on the top and side surfaces.

The first and second FETs 40 and 50 are also offset in a horizontal direction (e.g., along a Y-axis direction) parallel to the X-axis direction on planes of the nanosheets. However, compared to the nanosheet stack shown in FIG. 1A, the first and second source and drains S/D1 and S/D2 are swapped from one side to the other in order to simplify MOL wiring, so that the first and second source and drains S/D1 and S/D2 have an alternating structure as shown in FIG. 33C.

Figure 33E:
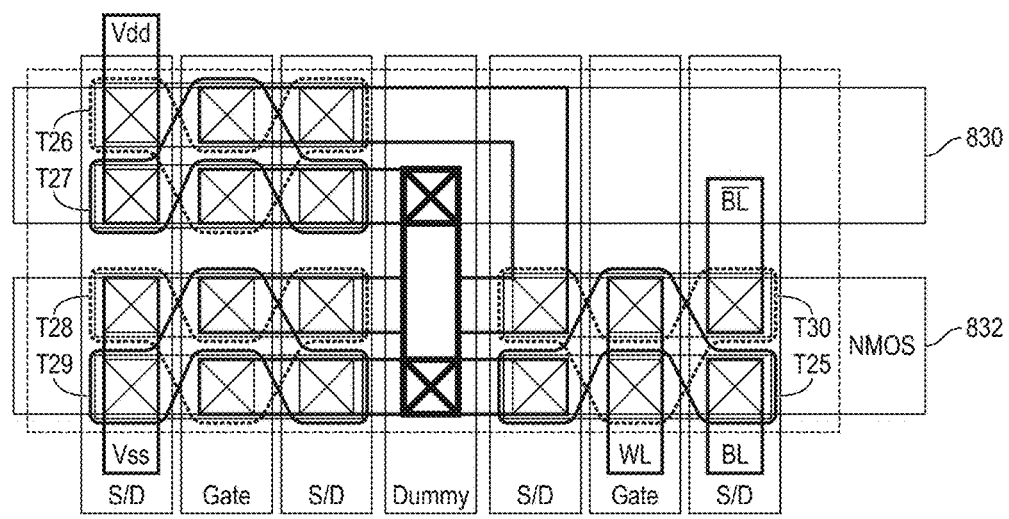

Referring to FIGS. 33A, 33D, and 33E, the 6T SRAM includes transistors T24 through T30. Transistors T26 and T27 may be PMOS transistors, and thus, may be formed with a nanosheet stack 830 having PMOS layers. Transistors T25 and T28 through T30 may be NMOS transistors, and thus, may be formed with a nanosheet stack 832 having NMOS layers.

Figure 34A:
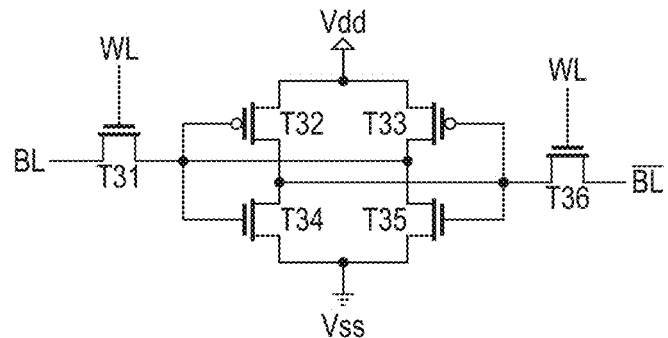
FIGS. 34A-34D illustrate a 6T SRAM in a 2T cell according to one or more example embodiments of the present invention.
Figure 34B:
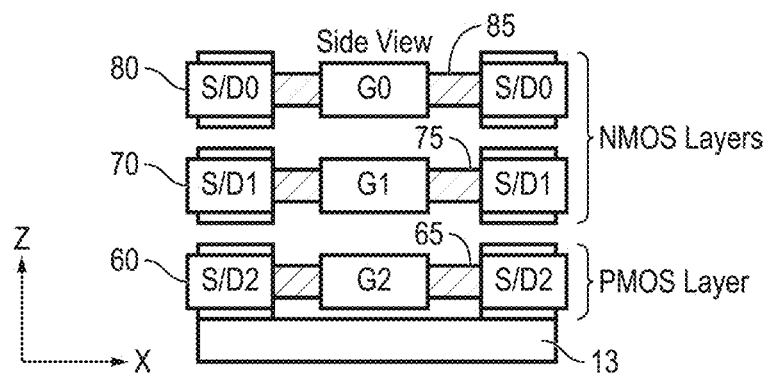
Figure 34C:
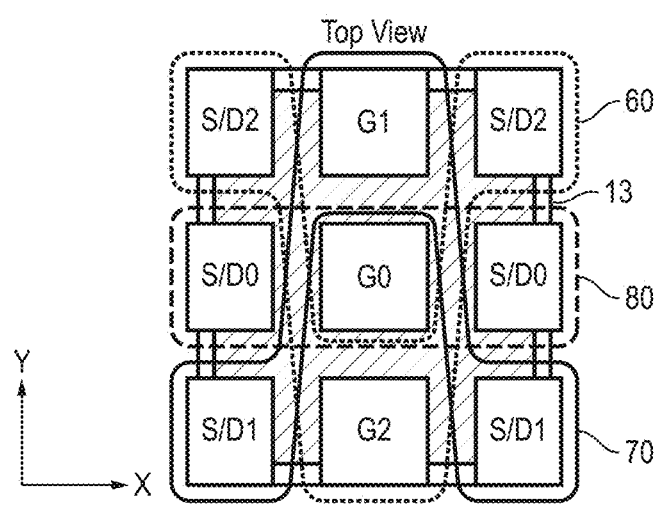
Figure 34D:
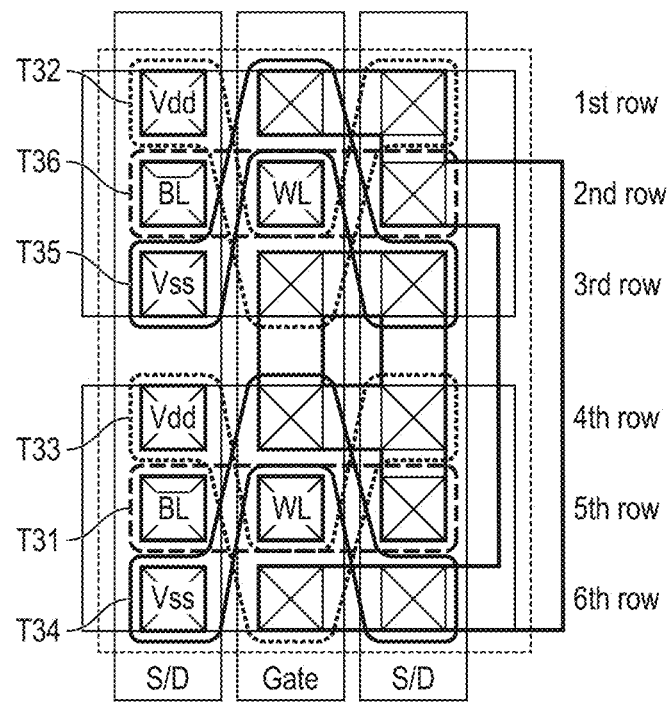

FIGS. 34A-34D illustrate a 6T SRAM in a 2T cell according to one or more example embodiments of the present invention. FIG. 34A is an equivalent circuit diagram of the 6T SRAM, FIG. 34B is a conceptual diagram of a side view of contacts of a nanosheet stack used for implementing the 6T SRAM, FIG. 34C is a conceptual diagram of a top view of contacts of the nanosheet stack used for implementing the 6T SRAM, FIG. 34D is a corresponding notional layout of a top view of contacts of the 6T SRAM implemented with the nanosheet stacks shown in FIGS. 34B and 34C according to an embodiment of the present invention.

Referring to FIGS. 34B and 34C, the nanosheet stack includes three field effect transistors (FETs) 60, 70, and 80 that are formed at three separate nanosheets on a substrate (e.g., a bottom oxide) 13 that are offset from each other along a vertical direction (e.g., along a Z-axis direction). According to one or more embodiments, the substrate 13 may be any suitable crystalline material suitable for epitaxial (e.g., single crystal) growth, for example, silicon, SiGe, etc.

A first FET (e.g., a lower FET) 60 includes a first source S2, a first gate G2, and a first drain D2 that are arranged along a horizontal direction (e.g., along an X-axis direction), wherein the gate G2 is configured to control a first channel 65. The first channel 65 may be a nanosheet having a PMOS layer. The first FET 60 may have fully independent source, gate, and drain contacts, each on top and side surfaces.

A second FET (e.g., a middle FET) 70 includes a second source S1, a second gate C1, and a second drain D1 that are arranged along the horizontal direction, wherein the second gate G1 is configured to control a second channel 75. The second channel 75 may be a nanosheet having an NMOS layer. The second FET 70 may have fully independent source, gate, and drain contacts, each on the top and side surfaces.

A third FET (e.g., an upper FET) 80 includes a third source S0, a third gate G0, and a third drain D0 that are arranged along the horizontal direction, wherein the third gate G0 is configured to control a third channel 85. The third channel 85 may be a nanosheet having an NMOS layer. The third FET 80 may have fully independent source, gate, and drain contacts, each on the top and side surfaces. Further, the third FET may be top contacted. That is, for example, when there are three stacked FETs, the bottom most FET may be accessed from one side, the middle FET may be accessed from another side, and the top most FET may be accessed from the top.

The first, second, and third FETs 60, 70, and 80 are also offset in a horizontal direction (e.g., along a Y-axis direction) parallel to the X-axis direction on planes of the nanosheets. However, compared to the nanosheet stack shown in FIG. 1A, the first and second source and drains S/D2 and S/D1 are swapped (e.g., contacts for the source and drain for the bottom most FET are on a same side as the gate from the middle FET) with the third source and drains S/D0 therebetween, so that the first and second source and drains S/D1 and S/D2 have an alternating structure as shown in FIG. 34C.

Referring to FIGS. 34A and 34D, the 6T SRAM includes transistors T31 through T36. Transistors T32 and T33 may be PMOS transistors, and transistors T31 and T34 through T36 may be NMOS transistors. Accordingly, the first row of contacts shown in FIG. 34D may include an NMOS gate for the transistor T35, and a PMOS source and drain for the transistor T32. The second row of contacts may include an NMOS source, gate, and drain for the transistor T36. The third row of contacts may include a PMOS gate for the transistor T32, and an NMOS source and drain for the transistor T35. The fourth row of contacts may include an NMOS gate for the transistor T34, and a PMOS source and drain for the transistor T33. The fifth row of contacts may include an NMOS source, gate, and drain for the transistor T31. The sixth row of contacts may include a PMOS gate for the transistor T33, and an NMOS source and drain for the transistor T34.

Figure 35A:
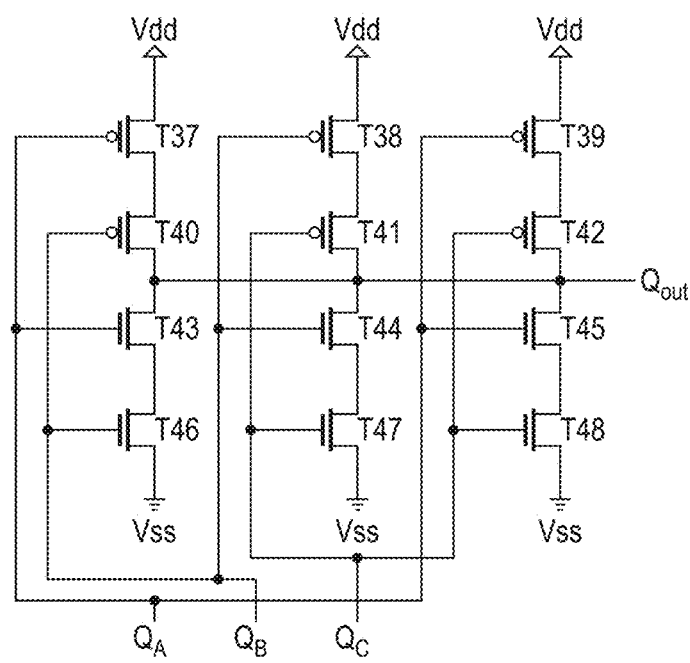
FIGS. 35A-35B illustrate a 12T Minority Gate Logic in a 6T cell according to one or more example embodiments of the present invention.
Figure 35B:
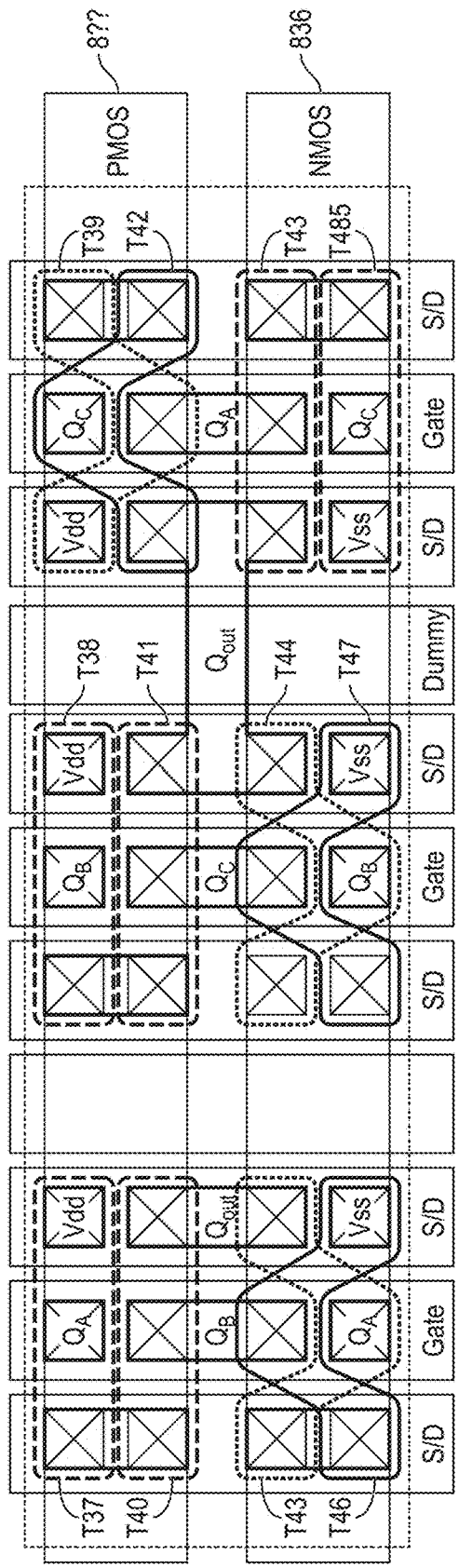

FIGS. 35A and 35B illustrate a 12T minority gate (e.g., or NOT majority gate) logic in a 6T cell according to one or more example embodiments of the present invention. According to one or more embodiments of the present invention, the 12T minority gate logic shown in FIG. 35B may be implemented with the nanosheet stack shown in FIG. 1A and the nanosheet stack shown in FIGS. 33B and 33C.

Referring to FIGS. 35A and 35B, the 12T minority gate logic includes transistors T37 to T48. Transistors T37 through T42 may be PMOS transistors, and thus, may be formed with a nanosheet stack 834 having PMOS layers. Transistors T43 through T48 may be NMOS transistors, and thus, may be formed with a nanosheet stack 836 having NMOS layers.

Figure 36A:
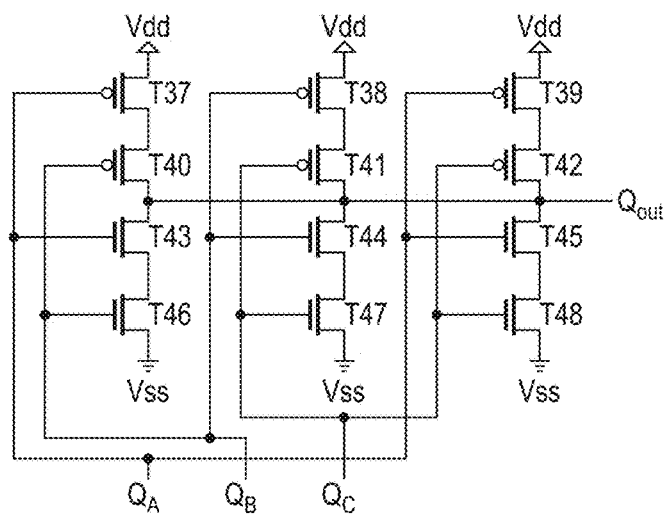
FIGS. 36A-36B illustrate a 12T Minority Gate Logic in a 3.5T cell according to one or more example embodiments of the present invention.
Figure 36B:
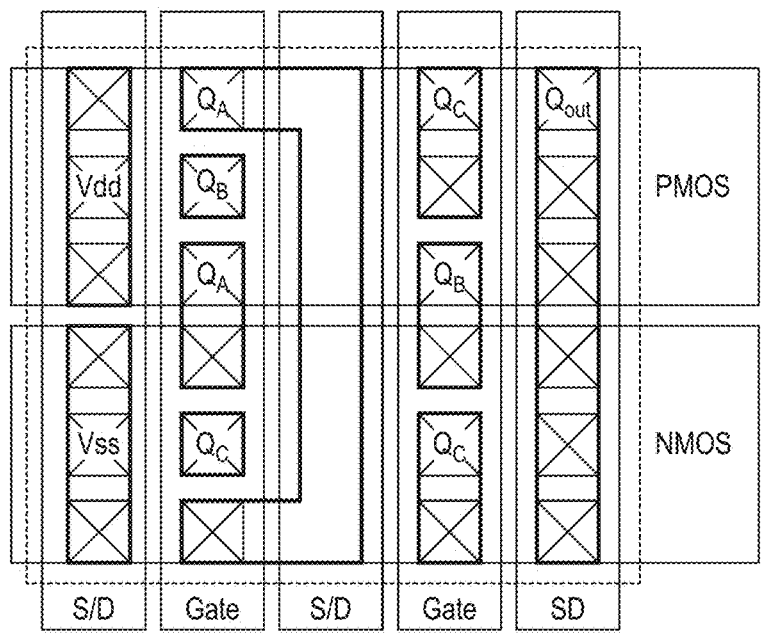

FIGS. 36A and 36B illustrate a 12T minority gate (e.g., or NOT majority gate) logic in a 3.5T cell according to one or more example embodiments of the present invention. FIG. 36B assumes that the 12T minority gate logic device is fabricated with a self-aligned process (e.g., SADP or SAQP), where the pattern of S/D, gate, S/D, gate, etc., is a byproduct of the method. Thus, the device shown in FIG. 36B includes a dead S/D in the middle, which may not be contacted. Further, carriers may have to cross the dead S/D to get from the S/D on the far left to the S/D on the far right, or vice versa, which may not be desired because a parasitic resistance penalty to transit this region.

However, the present invention is not limited thereto, and it may be more desirable to have two gates adjacent to one another, if not limited to the self-aligned process. For example, there may be a case where a node does not require a self-aligned process to achieve the small dimensions for CPP scaling. For example, if EUV lithography is available for high volume manufacturing in time for the node (e.g., a 7 nm node), then self-aligned processes may not be desired, and the device in FIG. 36B may be made without the dead S/D in the middle.

Figure 37:
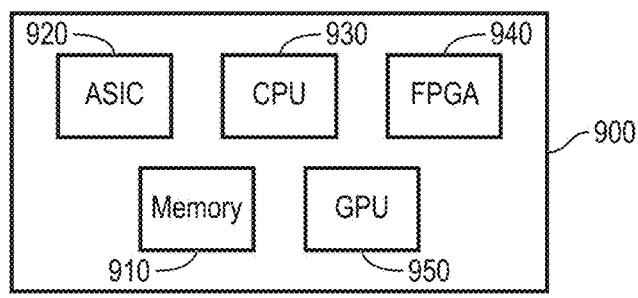
FIG. 37 illustrates an electronic device including a SICFET device according to one or more embodiments of the present invention.

FIG. 37 illustrates an electronic device including a SICFET according to one or more embodiments of the present invention.

Referring to FIG. 37, an electronic device 900 may include at least one of a memory 910, an application specific integrated circuit (ASIC) 920, a central processing unit (CPU) 930, a field programmable gate array (FPGA) 940, and a graphics processing unit (GPU) 950. The SICFET may be included in any one of the memory 910, the ASIC 920, the CPU 930, the FPGA 900, and the GPU 950.

The electronic device 900 may be a stand-alone system that uses the SICFET to perform one or more electrical functions. Alternatively, the electronic device 900 may be a subcomponent of a larger system. For example, the electronic device 900 may be part of a computer, a cellular phone, a personal digital assistant (PDA), a digital video camera (DVC), or other electronic communication device. Alternatively, the electronic device 900 may be the memory 910, the ASIC 920, the CPU 930, the FPGA 900, the GPU 950, a network interface card, or other signal processing card that can be inserted or included in a computer or other larger system.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A semiconductor device comprising:
   a substrate;
   a first active layer on the substrate and comprising a first channel between a source and a drain;
   a second active layer stacked on the first active layer in a direction normal to an upper surface of the substrate, the second active layer comprising a second channel between the source and the drain;
   a first gate corresponding to the first channel; and
   a second gate offset from the first gate in a direction parallel to the upper surface of the substrate, electrically separated from the first gate, and corresponding to the second channel.

2. The semiconductor device of claim 1, wherein the first and second active layers comprise nanosheets.

3. The semiconductor device of claim 1, wherein each of the channels is oriented in the direction parallel to the upper surface of the substrate.

4. The semiconductor device of claim 1, wherein the source and the drain comprises a first source and a first drain corresponding to the first channel, and a second source and a second drain corresponding to the second channel.

5. The semiconductor device of claim 1, further comprising:
   a third active layer stacked on the second active layer, wherein each of the first, second, and third active layers comprises two individually gated channel regions in series; and
   a third gate corresponding to the third active layer, wherein each of the first, second, and third gates is configured to control two of the channel regions in corresponding ones of the first, second, and third active layers, so that the device passes current through at least one of the channel layers when two or three of the first, second, and third gates are biased to an on state.

6. A semiconductor device comprising:
   a substrate;
   a first active layer on the substrate and comprising a first channel between a source and a drain;
   a second active layer stacked on the first active layer, the second active layer comprising a second channel between the source and the drain;
   a first gate corresponding to the first channel;
   a second gate electrically separated from the first gate and corresponding to the second channel; and
   a plurality of first active layers, each of the first active layers comprising a channel, at a same vertical level as the first active layer, and a plurality of second active layers, each of the second active layers comprising a channel, at a same vertical level as the second active layer, wherein one or more of the first and second active layers constitutes a FET.

7. The semiconductor device of claim 6, wherein at least two of the channels of the first and second active layers are configured to be controlled by a single gate contact.

8. A stacked independently contacted field effect transistor (SICFET) device comprising:
   a substrate;
   a first active layer on the substrate;
   a first low k layer on the first active layer;
   a first gate metal between the substrate and the first active layer, and between the first active layer and the first low k layer;
   a second active layer on the first low k layer and overlapping with the first active layer in a vertical direction;
   a second low k layer on the second active layer; and
   a second gate metal between the first low k layer and the second active layer, and between the second active layer and the second low k layer,
   wherein contacts of the first and second gate metals are aligned horizontally on a plane parallel to a top surface of the SICFET.

* * * * *